United States Patent
Kim et al.

(10) Patent No.: US 11,741,870 B2
(45) Date of Patent: Aug. 29, 2023

(54) ELECTRONIC DEVICE, METHOD, AND COMPUTER-READABLE STORAGE MEDIUM FOR REDUCING AFTERIMAGE IN DISPLAY AREA

(71) Applicant: Samsung Electronics Co., Ltd., Suwon-si (KR)

(72) Inventors: Jinhyun Kim, Suwon-si (KR); Jaesung Lee, Suwon-si (KR); Hanyuool Kim, Suwon-si (KR); Jongkon Bae, Suwon-si (KR); Yohan Lee, Suwon-si (KR); Seungkyu Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/733,547

(22) Filed: Apr. 29, 2022

(65) Prior Publication Data

US 2022/0415226 A1  Dec. 29, 2022

Related U.S. Application Data

(63) Continuation of application No. PCT/KR2022/004992, filed on Apr. 6, 2022.

(30) Foreign Application Priority Data

Jun. 23, 2021  (KR) ........................ 10-2021-0081649

(51) Int. Cl.
*G09G 3/00* (2006.01)
*H05K 5/00* (2006.01)

(52) U.S. Cl.
CPC .......... *G09G 3/035* (2020.08); *H05K 5/0017* (2013.01); *H05K 5/0086* (2013.01); *G09G 2320/0257* (2013.01)

(58) Field of Classification Search
CPC .......... G09G 3/035; G09G 2320/0257; H05K 5/0017; H05K 5/0086
See application file for complete search history.

(56) References Cited

U.S. PATENT DOCUMENTS 9,651,997 B2    5/2017   Browning
11,043,191 B1   6/2021   Kang et al.
(Continued)

FOREIGN PATENT DOCUMENTS

CN    109947338 A  *  6/2019
CN    112863363 A  *  5/2021  ............. G09F 9/301
(Continued)

OTHER PUBLICATIONS

International Search Report dated Jul. 22, 2022, issued in International Application No. PCT/KR2022/004992.

*Primary Examiner* — Ricardo Osorio
(74) *Attorney, Agent, or Firm* — Jefferson IP Law, LLP

(57) ABSTRACT

An electronic device is provided. The electronic device includes a housing, a display rollable into the housing, and a display driver circuitry operably coupled to the display. The display driver circuitry is configured to display, while the electronic device is in a first state in which a first display area of the display is exposed and a second display area of the display adjacent to the first display area is rolled into the housing, a first image in the exposed first display area, obtain, a second image based on applying a first weight to a pixel value of a first pixel of a first horizontal line and applying a second weight less than the first weight to a pixel value of a second pixel of the first horizontal line, and display, while displaying the first image, the second image in the second display area rolled into the housing.

20 Claims, 25 Drawing Sheets

(56) References Cited

U.S. PATENT DOCUMENTS 11,501,700 B2    11/2022  Han
2019/0197960 A1*  6/2019  Kim ...................... G09G 3/035

FOREIGN PATENT DOCUMENTS

| KR | 10-2017-0088452 A | 8/2017 |
| KR | 10-2019-0071486 A | 6/2019 |
| KR | 10-2020-0070657 A | 6/2020 |
| KR | 10-2020-0113532 A | 10/2020 |

* cited by examiner

ELECTRONIC DEVICE, METHOD, AND COMPUTER-READABLE STORAGE MEDIUM FOR REDUCING AFTERIMAGE IN DISPLAY AREA

CROSS-REFERENCE TO RELATED APPLICATION(S)

This application is a continuation application, claiming priority under § 365(c), of an International application No. PCT/KR2022/004992, filed on Apr. 6, 2022, which is based on and claims the benefit of a Korean patent application number 10-2021-0081649, filed on Jun. 23, 2021, in the Korean Intellectual Property Office, the disclosure of which is incorporated by reference herein in its entirety.

TECHNICAL FIELD

This disclosure relates to an electronic device. More particularly, the disclosure relates to method, and a computer-readable storage medium for reducing an afterimage in a display area of a rollable display.

BACKGROUND ART

An electronic device including a rollable display may provide a first state in which a portion of the rollable display is rolled into a housing of the electronic device and a second state in which the rolled portion of the rollable display is extended out of the housing. Providing the first state and the second state makes it possible for the electronic device to have a relatively more compact structure in use.

The above information is presented as background information only to assist with an understanding of the disclosure. No determination has been made, and no assertion is made, as to whether any of the above might be applicable as prior art with regard to the disclosure.

DISCLOSURE

Technical Problem

Aspects of the disclosure are to address at least the above-mentioned problems and/or disadvantages and to provide at least the advantages described below. Accordingly, an aspect of the disclosure is to provide an electronic device including a rollable display, in a state that a portion of a display area of the rollable display is exposed and a remaining part of the display area is rolled into a housing of the electronic device, may display an image in the exposed part of the display area among the exposed part of the display area and the remaining part of the display area. When the image continued to be displayed in the exposed part of the display area, an afterimage may be brought about at a boundary between the exposed part of the display area and the remaining part of the display area. In order to prevent or at least reduce such an afterimage, the electronic device according to an embodiment of the disclosure may display another image switched from the image in the remaining part of the display area rolled into the housing, while displaying the image in the exposed part of the display area.

The technical problems to be addressed in this document are not limited to those described above, and other technical problems not mentioned herein will be clearly understood by those having ordinary knowledge in the art to which the disclosure belongs, from the following description.

Additional aspects will be set forth in part in the description which follows and, in part, will be apparent from the description, or may be learned by practice of the presented embodiments.

Technical Solution

In accordance with an aspect of the disclosure, an electronic device is provided. The electronic device includes a housing, a display being rollable into the housing, and display driver circuitry, operably coupled to the display and configured to display, while the electronic device is in a first state in which a first display area of the display is exposed and a second display area of the display adjacent to the first display area is rolled into the housing, a first image in the exposed first display area, obtain, while displaying the first image, a second image based on applying a first weight to a pixel value of a first pixel of a first horizontal line of the first display area and applying a second weight less than the first weight to a pixel value of a second pixel of the first horizontal line of the first display area, wherein the first pixel of the first horizontal line of the first display area is spaced apart by a first distance from a boundary between the first display area and the second display area, and the second pixel is spaced apart by a second distance greater than the first distance from the boundary, and display, while displaying the first image in the first display area, the second image in the second display area rolled into the housing.

In accordance with another aspect of the disclosure, a method for operating an electronic device is provided. The method includes a housing and a display being rollable into the housing, according to an embodiment of the disclosure, may include displaying, while the electronic device is in a first state in which a first display area of the display is exposed and a second display area of the display adjacent to the first display area is rolled into the housing, a first image in the exposed first display area, obtaining, while displaying the first image, a second image based on applying a first weight to a pixel value of a first pixel of a first horizontal line of the first display area and applying a second weight less than the first weight to a pixel value of a second pixel of the first horizontal line of the first display area, wherein the first pixel is spaced apart by a first distance from a boundary between the first display area and the second display area, and the second pixel is spaced apart by a second distance greater than the first distance from the boundary, and displaying, while displaying the first image in the first display area, the second image in the second display area rolled into the housing.

At least one non-transitory computer-readable storage medium may store one or more programs including instructions which may cause, when executed by a processor of an electronic device including a housing and a display being rollable into the housing, the electronic device to display, while the electronic device is in a first state in which a first display area of the display is exposed and a second display area of the display adjacent to the first display area is rolled into the housing, a first image in the exposed first display area, obtain, while displaying the first image, a second image based on applying a first weight to a pixel value of a first pixel of a first horizontal line of the first display area and applying a second weight less than the first weight to a pixel value of a second pixel of the first horizontal line of the first display area, wherein the first pixel is spaced apart by a first distance from a boundary between the first display area and the second display area, and the second pixel is spaced apart by a second distance greater than the first distance from the boundary, and display, while displaying the first image in the first display area, the second image in the second display area rolled into the housing.

Advantageous Effects

An electronic device including a display being rollable into a housing according to an embodiment can display, in a portion of a display area of the display rolled into the housing, a second image switched from a first image displayed in a remaining part of the display area exposed towards the outside, so as to reduce an afterimage caused between the part of the display area and the remaining part of the display area.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description, taken in conjunction with the accompanying drawings, in which.

Throughout the drawings, like reference numerals will be understood to refer to like parts, components, and structures.

MODE FOR INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
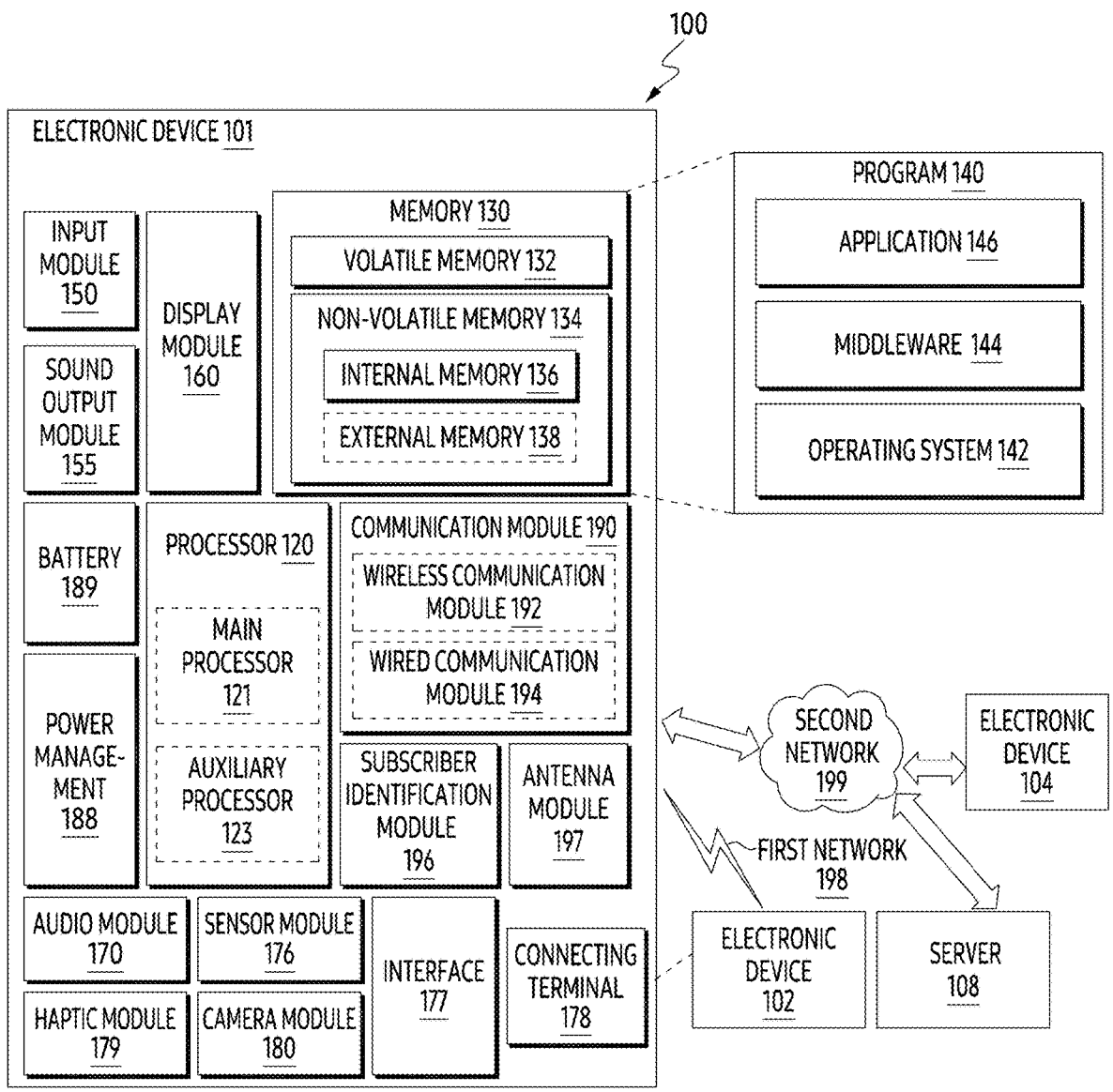
FIG. 1 is a block diagram of an electronic device in a network environment according to an embodiment of the disclosure.

FIG. 1 is a block diagram of an electronic device in a network environment according to an embodiment of the disclosure.

Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment of the disclosure, the electronic device 101 may communicate with the electronic device 104 via the server 108. According to an embodiment of the disclosure, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments of the disclosure, at least one of the components (e.g., the connecting terminal 178) may be omitted from the electronic device 101, or one or more other components may be added in the electronic device 101. In some embodiments of the disclosure, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment of the disclosure, as at least part of the data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an embodiment of the disclosure, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment of the disclosure, the auxiliary processor 123 (e.g., an image signal processor or a communication processor) may be implemented as part of another component (e.g., the camera module 180 or the communication module 190) functionally related to the auxiliary processor 123. According to an embodiment of the disclosure, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment of the disclosure, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment of the disclosure, the display module 160 may include a touch sensor adapted to detect a touch, or a pressure sensor adapted to measure the intensity of force incurred by the touch.

The audio module 170 may convert a sound into an electrical signal and vice versa. According to an embodiment of the disclosure, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment of the disclosure, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment of the disclosure, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment of the disclosure, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 179 may include, for example, a motor, a piezoelectric element, or an electric stimulator.

The camera module 180 may capture a still image or moving images. According to an embodiment of the disclosure, the camera module 180 may include one or more lenses, image sensors, image signal processors, or flashes.

The power management module 188 may manage power supplied to the electronic device 101. According to one embodiment of the disclosure, the power management module 188 may be implemented as at least part of, for example, a power management integrated circuit (PMIC).

The battery 189 may supply power to at least one component of the electronic device 101. According to an embodiment of the disclosure, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to address, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment of the disclosure, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment of the disclosure, the antenna module 197 may include an antenna including a radiating element including a conductive material or a conductive pattern formed in or on a substrate (e.g., a printed circuit board (PCB)). According to an embodiment of the disclosure, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment of the disclosure, another component (e.g., a radio frequency integrated circuit (RFIC)) other than the radiating element may be additionally formed as part of the antenna module 197.

According to various embodiments of the disclosure, the antenna module 197 may form a mmWave antenna module. According to an embodiment of the disclosure, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment of the disclosure, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment of the disclosure, the external electronic device 104 may include an internet-of-things (IoT) device. The server 108 may be an intelligent server using machine learning and/or a neural network. According to an embodiment of the disclosure, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
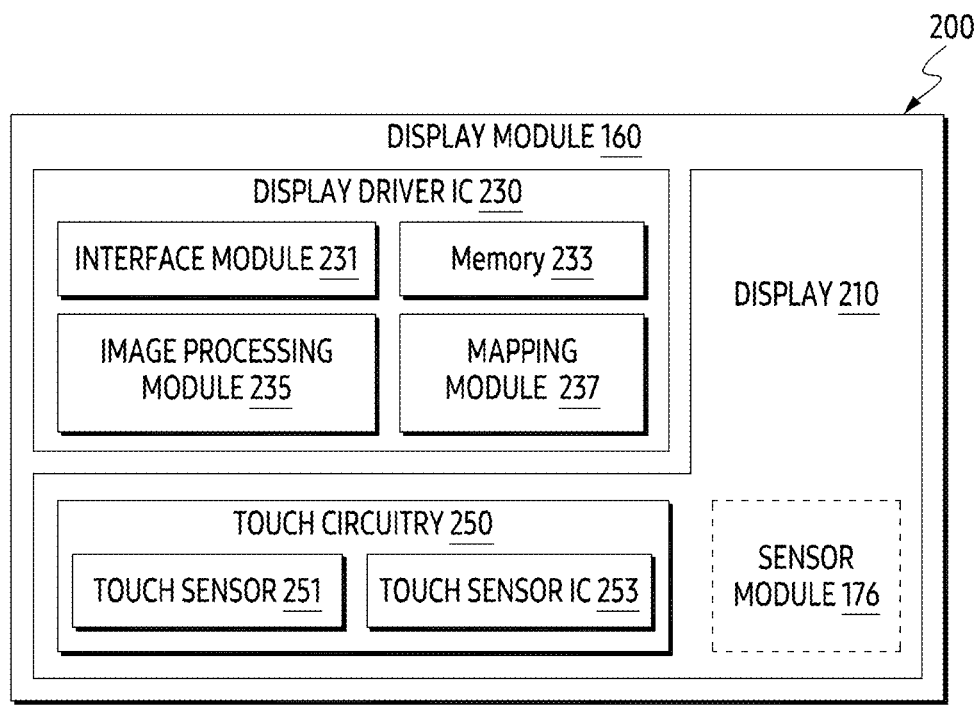
FIG. 2 is a block diagram of a display module according to an embodiment of the disclosure.

FIG. 2 is a block diagram 200 illustrating a display module 160 according to an embodiment of the disclosure.

Referring to FIG. 2, the display module 160 may include a display 210 and a display driver integrated circuit (DDI) 230 to control the display 210. The DDI 230 may include an interface module 231, a memory 233 (e.g., buffer memory), an image processing module 235, or a mapping module 237. The DDI 230 may receive image information that contains image data or an image control signal corresponding to a command to control the image data from another component of the electronic device 101 via the interface module 231. For example, according to an embodiment of the disclosure, the image information may be received from the processor 120 (e.g., the main processor 121 (e.g., an application processor)) or the auxiliary processor 123 (e.g., a graphics processing unit) operated independently from the function of the main processor 121. The DDI 230 may communicate, for example, with touch circuitry 250 or the sensor module 176 via the interface module 231. The DDI 230 may also store at least part of the received image information in the memory 233, for example, on a frame by frame basis. The image processing module 235 may perform pre-processing or post-processing (e.g., adjustment of resolution, brightness, or size) with respect to at least part of the image data, based at least in part on characteristics of the display 210. The mapping module 237 may generate a voltage value or a current value corresponding to the image data pre-processed or post-processed by the image processing module 235. According to an embodiment of the disclosure, the generating of the voltage value or current value may be performed, for example, based at least in part on one or more attributes of the pixels (e.g., an array, such as an RGB stripe or a pentile structure, of the pixels, or the size of each subpixel). At least some pixels of the display 210 may be driven, for example, based at least in part on the voltage value or the current value such that visual information (e.g., a text, an image, or an icon) corresponding to the image data may be displayed via the display 210.

According to an embodiment of the disclosure, the display module 160 may further include the touch circuitry 250. The touch circuitry 250 may include a touch sensor 251 and a touch sensor IC 253 to control the touch sensor 251. The touch sensor IC 253 may control the touch sensor 251 to detect a touch input or a hovering input with respect to a certain position on the display 210. To address this, for example, the touch sensor 251 may detect (e.g., measure) a change in a signal (e.g., a voltage, a quantity of light, a resistance, or a quantity of one or more electric charges) corresponding to the certain position on the display 210. The touch circuitry 250 may provide input information (e.g., a position, an area, a pressure, or a time) indicative of the touch input or the hovering input detected via the touch sensor 251 to the processor 120. According to an embodiment of the disclosure, at least part (e.g., the touch sensor IC 253) of the touch circuitry 250 may be formed as part of the display 210 or the DDI 230, or as part of another component (e.g., the auxiliary processor 123) disposed outside the display module 160.

According to an embodiment of the disclosure, the display module 160 may further include at least one sensor (e.g., a fingerprint sensor, an iris sensor, a pressure sensor, or an illuminance sensor) of the sensor module 176 or a control circuit for the at least one sensor. In such a case, the at least one sensor or the control circuit for the at least one sensor may be embedded in one portion of a component (e.g., the display 210, the DDI 230, or the touch circuitry 250)) of the display module 160. For example, when the sensor module 176 embedded in the display module 160 includes a biometric sensor (e.g., a fingerprint sensor), the biometric sensor may obtain biometric information (e.g., a fingerprint image) corresponding to a touch input received via a portion of the display 210. As another example, when the sensor module 176 embedded in the display module 160 includes a pressure sensor, the pressure sensor may obtain pressure information corresponding to a touch input received via a partial or whole area of the display 210. According to an embodiment of the disclosure, the touch sensor 251 or the sensor module 176 may be disposed between pixels in a pixel layer of the display 210, or over or under the pixel layer.

Figure 3A:
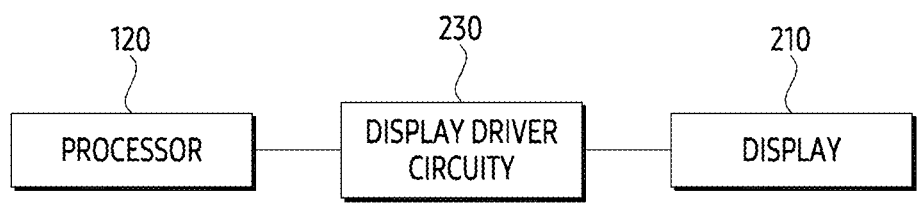
FIG. 3A is a simplified block diagram of an electronic device according to an embodiment of the disclosure.

FIG. 3A is a simplified block diagram of an electronic device according to an embodiment of the disclosure.

This block diagram may indicate a schematic functional configuration of the electronic device 101 shown in FIG. 1.

Referring to FIG. 3A, the electronic device 101 may include a processor 120, a display 210, and a display driver circuitry 230.

In an embodiment of the disclosure, the processor 120 may include the processor 120 shown in FIG. 1. In an embodiment of the disclosure, the processor 120 may be operatively or operably coupled with or connected with the display driver circuitry 230.

In an embodiment of the disclosure, the display 210 may include the display 210 shown in FIG. 2. In an embodiment of the disclosure, the display 210 may be operatively coupled or connected with the display driver circuitry 230. In an embodiment of the disclosure, the display 210 may be a rollable display in which a portion of a display area of the display 210 may be rolled into a housing of the electronic device 101. In an embodiment of the disclosure, the display 210 may provide a plurality of operation states.

Figure 3B:
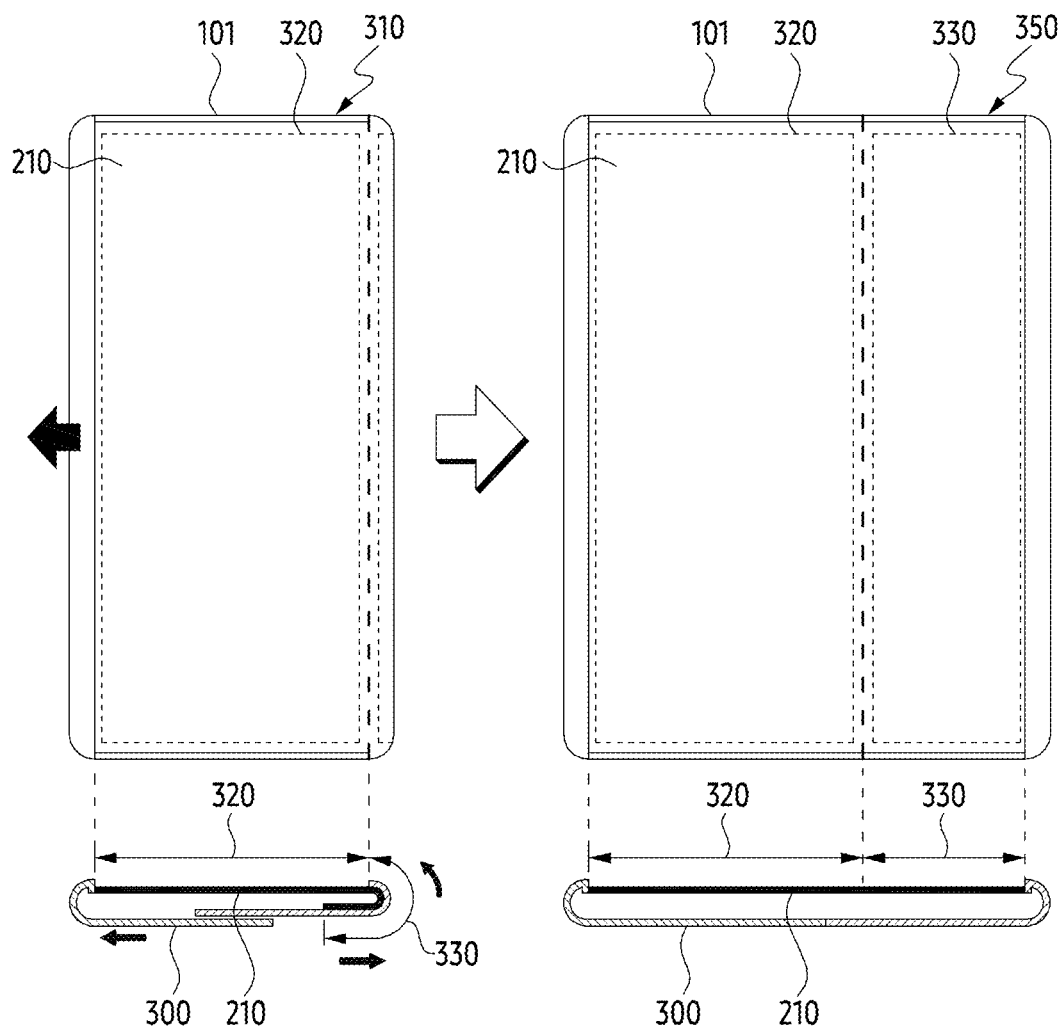
FIG. 3B illustrates multiple states of a display of an electronic device according to an embodiment of the disclosure.

The plurality of operation states that may be provided by the display 210 are illustrated on FIG. 3B.

FIG. 3B illustrates a plurality of operation states of a display of an electronic device according to an embodiment of the disclosure.

Referring to FIG. 3B, the display 210 of the electronic device 101 may provide, as one state of the plurality of operation states, a state 310 in which a part of the display area of the display 210 is exposed and a remaining portion the display 210 is rolled into the housing 300. The state 310 may be a state in which the display 210 provides a minimum size of viewable area. The state 310 may be a state in which the display 210 provides an exposed display area having its minimum size. The state 310 may be a state in which there is no more display area of the display 210 to be rolled into the housing, due to the limitation of a space formed by the housing 300. In the state 310, a portion of the exposed display area may be referred to as a first display area 320. In the state 310, the remaining part of the display area rolled into the housing 300 may be referred to as a second display area 330. In the state 310, the first display area 320 may be a viewable display area. In the state 310, the first display area 320 may be a display area exposed out of the housing 300. In the state 310, the second display area 330 may be a non-viewable display area being rolled into the housing 300. In the state 310, the second display area 330 may be a part of the display area rolled into the housing 300 so as to be covered with the housing 300.

The display 210 may provide, as another state of the plurality of operation states, a state 350 in which the entire display area of the display 210 is exposed. The state 350 may be a state in which the display 210 provides a maximum size of viewable display area. The state 350 may be a state in which the display 210 provides an exposed display area having a maximum size. The state 350 may be a state in which there is no more display area to be extended out of the housing 300. In the state 350, both the first display area 320 and the second display area 330 may be viewable display areas. In the state 350, the first display area 320 and the second display area 330 may be display areas exposed out of the housing 300.

Although not shown in FIG. 3B, the display 210 may provide an intermediate state between the state 310 and the state 350. The intermediate state may imply a state in which the first display area 320 and part of the second display area 330 are exposed and remaining part of the second display area 330 is rolled into the housing. In the intermediate state, the first display area 320 and the part of the second display area 330 may be viewable display areas. In the intermediate state, the first display area 320 and the part of the second display area 330 may be display areas exposed out of the housing 300. In the intermediate state, the remaining part of the second display area 330 may be part of the display area rolled into the housing 300 so as to be not viewable. In the intermediate state, the remaining part of the second display area 330 may be part of the display area covered by the housing 300, being rolled into the housing 300. In the intermediate state, the first display area 320 and the part of the second display area 330 may be referred to as a third display area. In the intermediate state, the remaining part of the second display area 330 may be referred to as a fourth display area.

Referring again to FIG. 3A, in an embodiment of the disclosure, the display driver circuitry 230 may include the display driver IC 230 shown in FIG. 2. In an embodiment of the disclosure, the display driver circuitry 230 may control the display 210 to display an image. In an embodiment of the disclosure, the display driver circuitry 230 may display an image in at least part of the display area of the display 210 according to the control of the processor 120. In another embodiment of the disclosure, the display driver circuitry 230 may display an image in at least part of the display area of the display 210, independently of the control of the processor 120. For example, the display driver circuitry 230 may display an image in at least part of the display area of the display 210, while the processor 120 is in a low-power state. However, it is not limited thereto.

In an embodiment of the disclosure, the display driver circuitry 230 may display an image in a part of the display area of the display 210 exposed out of the housing of the electronic device 101, and provide a black image, distinct from the displayed image, in a remaining part of the display area rolled into the housing, while displaying the image in the part of the display area. The black image may be an image in which the color in the entire area are configured with black. In an embodiment of the disclosure, the black image may be provided by inactivating pixels in the remaining part of the display area. In an embodiment of the disclosure, the black image may be provided by rendering the black image using pixels in the remaining part of the display area. However, it is not limited thereto.

After a certain period of time has elapsed subsequent to displaying the image within the part of the display area and providing the black image in the remaining part of the display area, when the remaining part of the display area is extended out of the housing, an afterimage may be caused at a boundary between the part of the display area exposed out of the housing and the remaining part of the display area exposed out of the housing.

Figure 4:
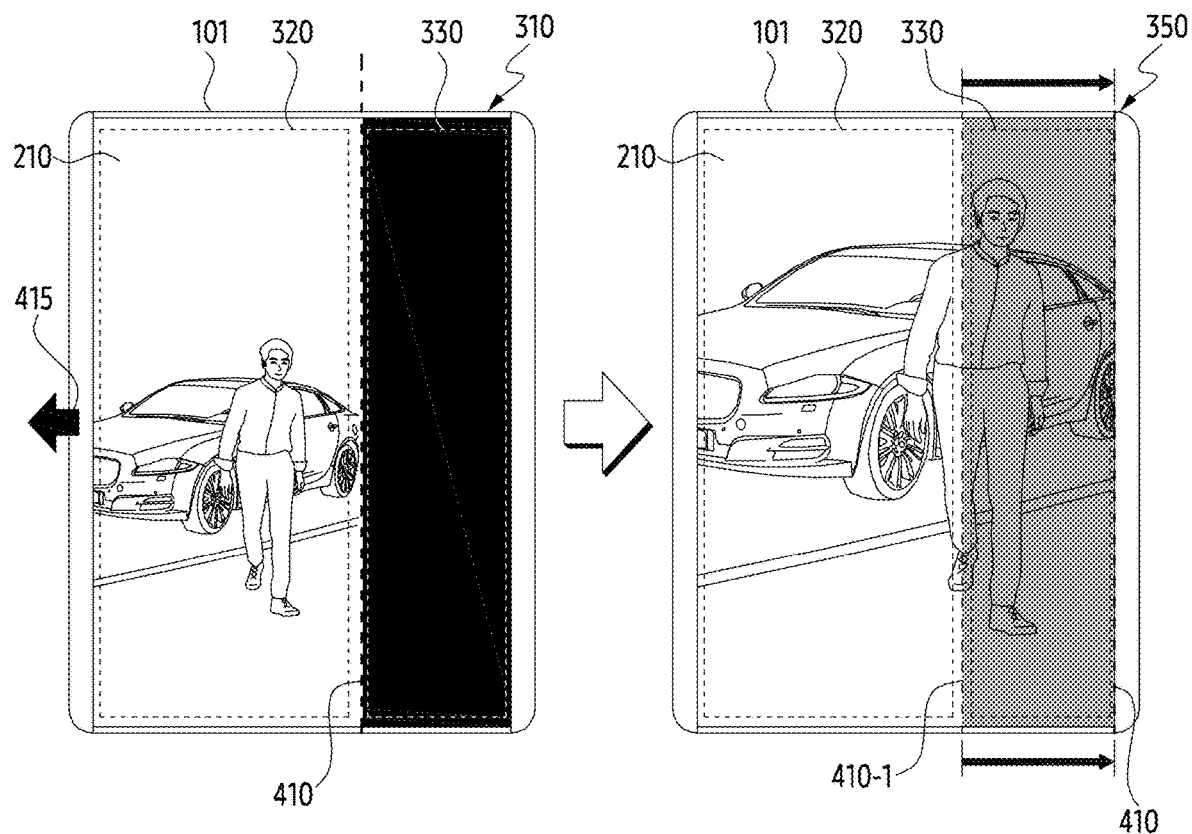
FIG. 4 illustrates an afterimage caused at a boundary between an exposed display area and a display area rolled into a housing of an electronic device according to an embodiment of the disclosure.

The afterimage may be exemplified through the description of FIG. 4.

FIG. 4 illustrates an afterimage caused at a boundary between an exposed display area and a display area rolled into a housing of an electronic device according to an embodiment of the disclosure.

Referring to FIG. 4, the display area of the display 210 may be defined with respect to a boundary 410. For example, an area to the left of the boundary 410 may be a viewable display area exposed out of the housing, while an area to the right of the boundary 410 may be not a viewable display area rolled into the housing. For example, in the state 310, the first display area 320, which is disposed to the left of the boundary 410, may be of a viewable display area exposed out of the housing, and the second display area 330, which is disposed to the right of the boundary 410, may be not of a viewable display area rolled into the housing. As another example, in the state 350, the first display area 320 and the second display area 330, being disposed to the left of the boundary 410, may be viewable display areas exposed out of the housing. In the state 350, the absence of any display area to the right of the boundary 410 may imply that there is no more display area rolled into the housing.

In the state 310, the display driver circuitry 230 may display the image in the first display area 320 exposed out of the housing, which is a left-sided area to the boundary 410, and provide the black image in the second display area 330 rolled into the housing, which is a right-sided area to the boundary 410. After the state 310 is maintained for a certain period of time, the state 310 may be switched to the state 350. For example, when it is received a user input 415 for sliding one end of the housing of the electronic device 101 to extend the display area of the display 210 after the state 310 is maintained for a certain period of time, the state 310 may be switched to the state 350. In the state 350 switched from the state 310, the display driver circuitry 230 may display the image displayed in the first display area 320 in the state 310 in both the first display area 320 and the second display area 330 in an enlarged size. The image displayed in the enlarged size in the state 350 may include more various information than the image displayed in the state 310. The image displayed in the enlarged size in the state 350 may include a visual object having a size larger than that of the visual object of the image displayed in the state 310. However, it is not limited thereto. In an embodiment of the disclosure, an application installed in the electronic device 101 providing the image displayed in the enlarged size in the state 350 may be the same as the application installed in the electronic device 101 providing the image displayed in the state 310. However, it is not limited thereto. The image having the enlarged size, being displayed in response to switching from the state 310 to the state 350, may include an afterimage in the vicinity of the boundary 410-1, which was the boundary between the first display area 320 and the second display area 330 in the state 310, owing to a difference between the luminance of the first display area 320 having displayed the image in the state 310 and the luminance of the second display area 330 having provided the black image in the state 310. The afterimage may be caused due to the difference in voltage between a gate-source voltage of a driving transistor for each of the pixels in the first display area 320, that provided the image in state 310, in the vicinity of the boundary 410-1, and a gate-source voltage of a driving transistor for each of the pixels in the second display area 330, that provided the black image in state 310, in the vicinity of the boundary 410-1. Meanwhile, the afterimage may disappear after a lapse of a certain time.

Referring back to FIG. 3A, in an embodiment of the disclosure, while displaying the image in a part of the display area of the display 210 exposed out of the housing, the display driver circuitry 230 may display another image switched from the image in the remaining part of the display area of the display 210 rolled into the housing, in order to prevent occurrence of the afterimage or at least minimize the afterimage. The other image may be an image obtained based on the image to prevent or at least minimize the afterimage. The other image may be an image including a partial area identical or similar to the partial area of the image adjacent to a boundary between the part of the display area and the remaining part of the display area, in order to prevent or at least minimize the afterimage. For example, a partial area of the other image that is the same as or similar to the partial area of the image may be located adjacent to the boundary within the other image. However, it is not limited thereto.

In an embodiment of the disclosure, the other image may be obtained from the image by the processor 120, provided from the processor 120 to the display driver circuitry 230, and displayed by the display driver circuitry 230 in part of the display area. In another embodiment of the disclosure, the other image may be obtained from the image by the display driver circuitry 230 and displayed by the display driver circuitry 230.

Figure 5:
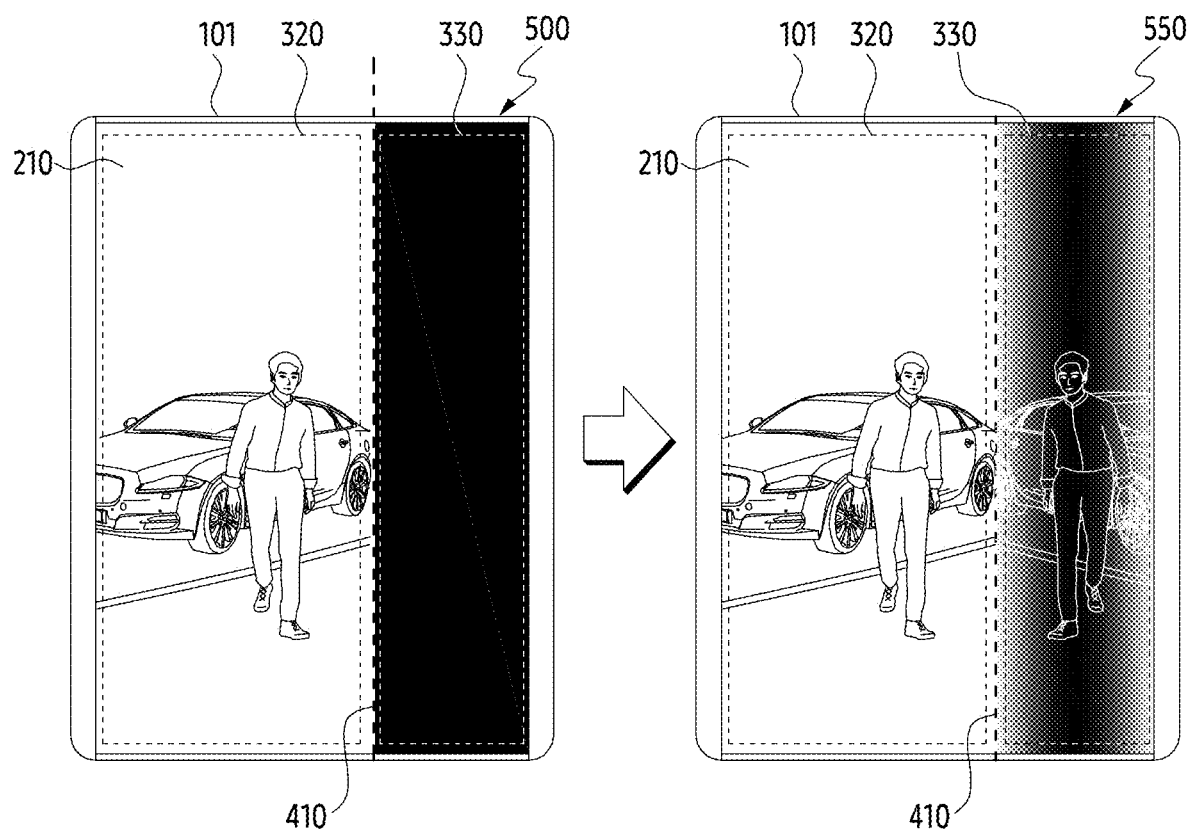
FIG. 5 illustrates displaying a second image obtained based on a first image in a second display area according to an embodiment of the disclosure.

An example of displaying a second image, which corresponds to the other image, may be exemplified with reference to FIG. 5.

FIG. 5 illustrates displaying a second image obtained based on a first image in a second display area according to an embodiment of the disclosure.

Referring to FIG. 5, the processor 120 may obtain data for the image to be displayed in the first display area 320 of the display 210 exposed out of the housing, and provide the data to the display driver circuitry 230. A portion of the data may be used to display the image in the first display area 320, and another portion of the data may be used to provide the black image in the second display area 330 rolled into the housing. The display driver circuitry 230 may display, based on obtaining the data from the processor 120, the image in the first display area 320 exposed out of the housing, as in the state 500, and provide the black image in the second display area 330 rolled into the housing. The display driver circuitry 230 may obtain the other image switched from the image in order to prevent the afterimage or at least minimize the afterimage, based on obtaining the data from the processor 120. For example, the display driver circuitry 230 may obtain the other image based on the image, while displaying the image and providing the black image. The display driver circuitry 230 may display the image in the first display area 320 and display the other image in the second display area 330, as in the state 550, based on obtaining the other image. In other words, the display driver circuitry 230 may switch the black image provided in the second display area 330 to the other image, as in the state 550, based on obtaining the other image. Since the other image displayed in state 550 is obtained based on the image, the other image is usable for reducing the difference in voltage between a gate-source voltage of a driving transistor for each of pixels in the first display area 320 adjacent to the boundary 410 in state 550, and a gate-source voltage of a driving transistor for each of pixels in the second display area 330 adjacent to the boundary 410 in the state 550. In other words, the other image displayed in the state 550 may be displayed in the second display area 330 to prevent, minimize, or reduce the afterimage.

Referring again to FIG. 3A, in an embodiment of the disclosure, while the image is displayed within a part of the display area of the display 210 exposed out of the housing and the other image is displayed in a remaining part of the display area of the display 210 rolled into the housing, a user input may be received to at least partially extend the remaining part of the display area rolled into the housing, out of the housing. The size of the display area of the display 210 exposed out of the housing may change according to the user input, and the processing of the display area of the display 210 exposed out of the housing and the display area of the display 210 rolled into the housing may be executed by the electronic device 101.

Figure 6:
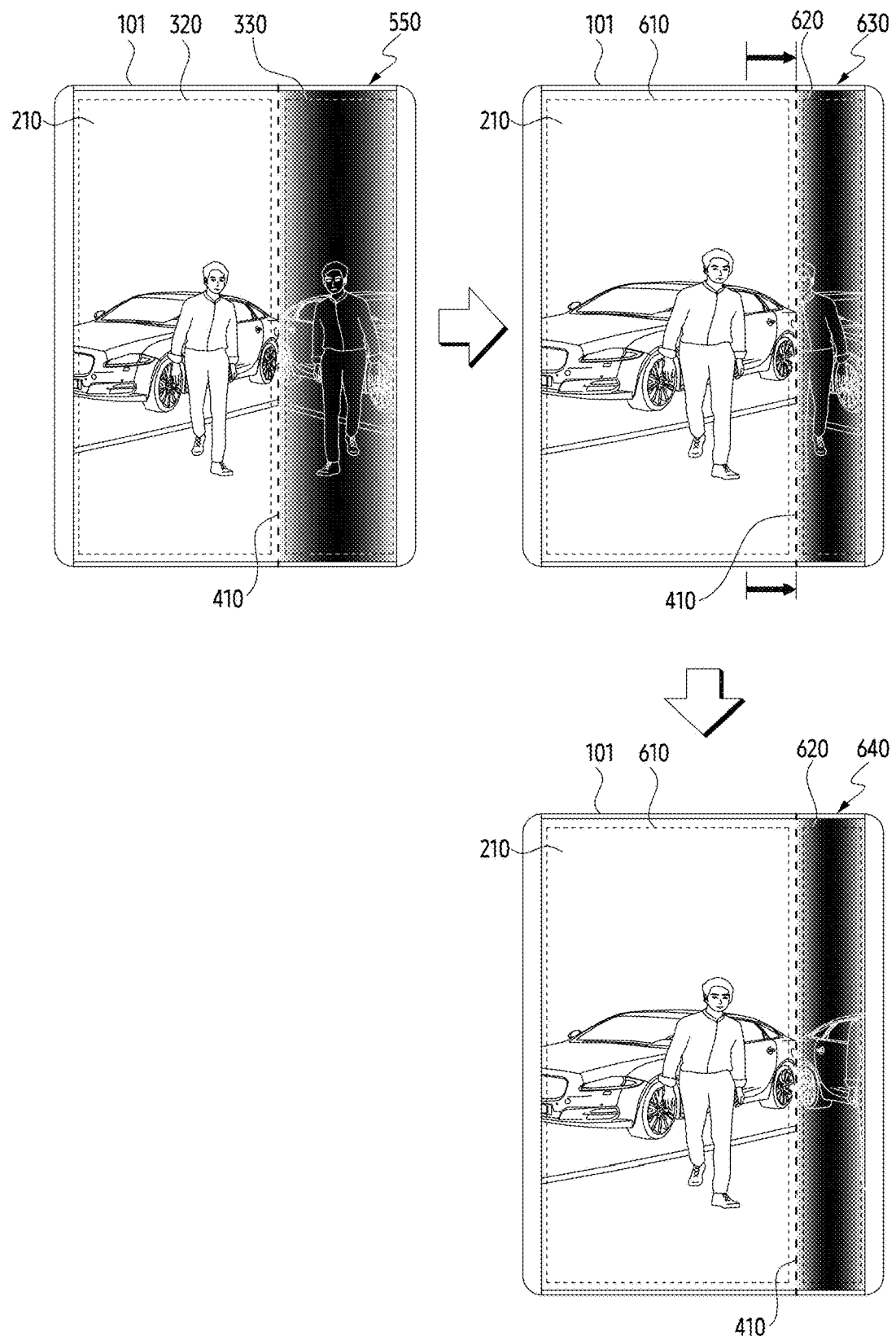
FIG. 6 illustrates switching a second image displayed in a second display area into a fourth image based on a third image following a first image in the second display area according to an embodiment of the disclosure.

FIG. 6 exemplifies the processing of the display area of the display 210 exposed out of the housing and the processing of the display area of the display 210 rolled into the housing.

FIG. 6 illustrates switching a second image displayed in a second display area to a fourth image, based on a third image following a first image in a second display area, according to an embodiment of the disclosure.

Referring to FIG. 6, in the state 550 of displaying the image in the first display area 320 and displaying the other image in the second display area 330, the processor 120 may identify a user input to extend part of the second display area 330 rolled into the housing, out of the housing. Based on identifying the user input, the processor 120 may obtain data for the image to be displayed in an enlarged size in a third display area 610 including the first display area 320 and the part of the second display area 330, and provide the data to the display driver circuitry 230. A portion of the data may be used to display the image to be displayed in the enlarged size in the third display area 610, and another portion of the data may be used to provide the black image in the fourth display area 620 that corresponds to a remaining part of the second display area 330 rolled into the housing. The display driver circuitry 230 may display, based on obtaining the data from the processor 120, display the image in the enlarged size in the third display area 610 exposed out of the housing, as in the state 630, and display part of the other image displayed in the state 550 in the fourth display area 620 rolled into the housing. The image displayed in the enlarged size in the state 630 may include more various information than the image displayed in the state 550. The image displayed in the enlarged size in the state 630 may include a visual object having a size larger than that of the visual object of the image displayed in the state 550. However, it is not limited thereto. In an embodiment of the disclosure, an application installed in the electronic device 101 providing the image displayed in the enlarged size in the state 630 may be the same as the application installed in the electronic device 101 providing the image displayed in the state 550. However, it is not limited thereto.

In the meantime, the display driver circuitry 230 may obtain another image switched from the image in order to prevent the afterimage or at least minimize the afterimage, based on obtaining the data from the processor 120. The other image may be an image to be displayed in the fourth display area 620. For example, while displaying the image in the third display area 610 and displaying part of the other image displayed in the state 550 in the fourth display area 620, the display driver circuitry 230 may obtain the other image to be displayed in the fourth display area 620, based on the image having the enlarged size. Based on obtaining the image to be displayed in the fourth display area 620, the display driver circuitry 230 may display, as in the state 640, the image in the enlarged size in the third display area 610 and display the other image in the fourth display area 620. Since the other image displayed in state 640 is obtained based on the image having the enlarged size, the other image is usable for reducing the difference in voltage between a gate-source voltage of a driving transistor for each of the pixels in third display area 610 adjacent to the boundary 410 in the state 640, and a gate-source voltage of a driving transistor for each of the pixels in the fourth display area 620 adjacent to the boundary 410 in the state 640. In other words, the other image displayed in the state 640 may be displayed in the fourth display area 620 in order to prevent, minimize, or reduce the afterimage.

Referring back to FIG. 3A, in an embodiment of the disclosure, while displaying the first image, that is, the image in the first display area that is a part of the display area of the display 210 exposed out of the housing, the display driver circuitry 230 may obtain the second image, that is the other image, based on the distance between the boundary between the first display area and the second display area, that is, the remaining part of the display area of the display 210 rolled into the housing, and each of the pixels in the first display area displaying the first image. In an embodiment of the disclosure, while displaying the first image in the first display area, the display driver circuitry 230 may obtain the second image, based on applying a weight to a pixel value of a pixel of a horizontal line of the first display area spaced apart by a first distance from the boundary and applying another weight, being less than the weight, onto a pixel value of another pixel of the horizontal line of the first display area spaced apart by a second distance greater than the first distance from the boundary. The display driver circuitry 230 may display the second image in the second display area while displaying the first image in the first display area, based on obtaining the second image. Since the second image is obtained based on the distance between the boundary and each of pixels in the first display area displaying the first image, displaying the second image makes it possible to prevent, minimize, or reduce occurrence of the afterimage in the vicinity of the boundary.

Figure 7:
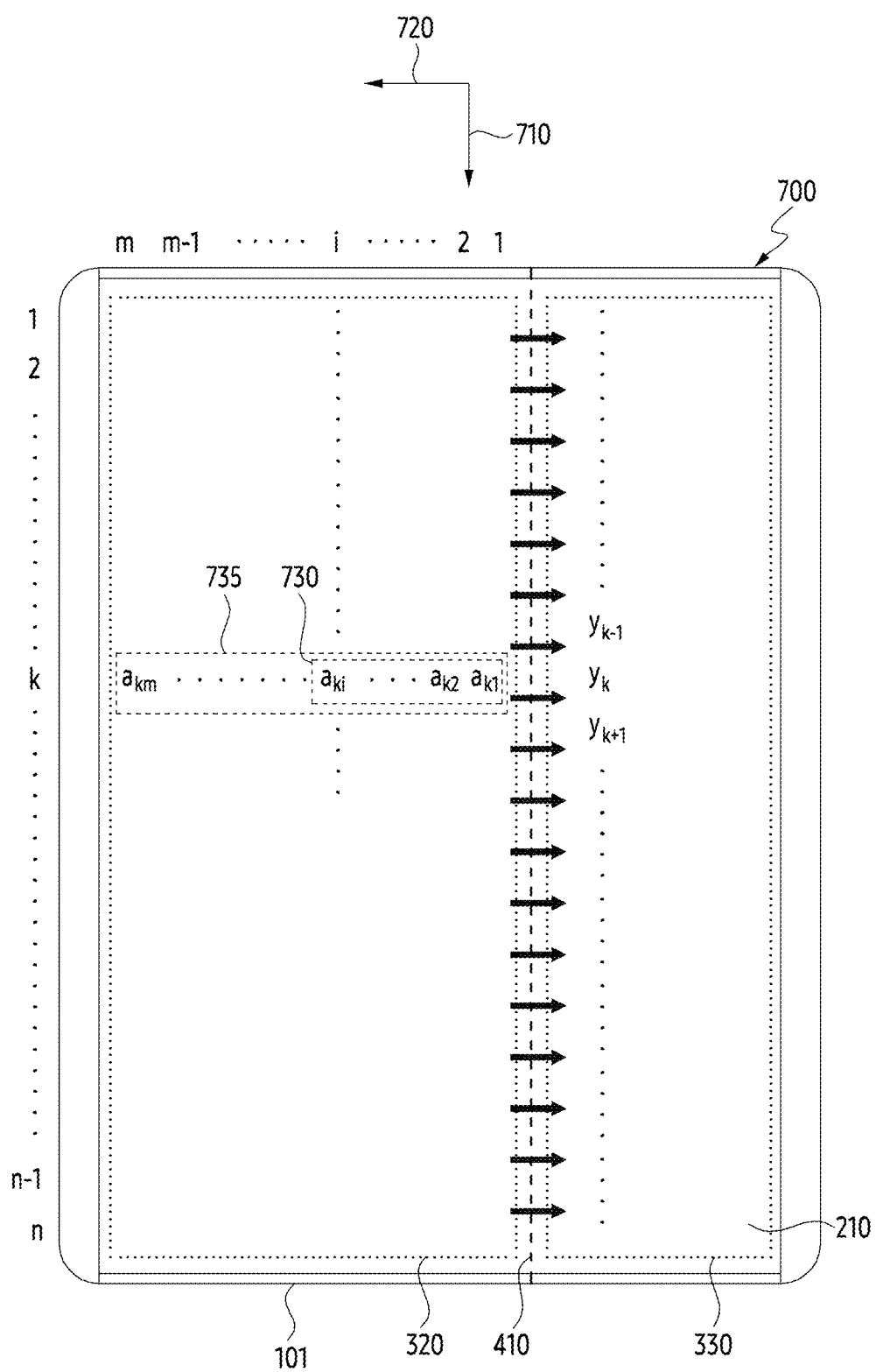
FIG. 7 illustrates obtaining a second image based on a boundary between a first display area and a second display area according to an embodiment of the disclosure.

FIG. 7 exemplifies an example of obtaining the second image based on the distance between the boundary and each of pixels in the first display area displaying the first image.

FIG. 7 illustrates obtaining a second image based on a boundary between a first display area and a second display area according to an embodiment of the disclosure.

Referring to FIG. 7, in the state 700, the display driver circuitry 230 may display the first image in the first display area 320 exposed out of the housing. In an embodiment of the disclosure, the first display area 320 may be configured of first to m-th lines (wherein 'm' is a natural number greater than 1) formed in a first direction 710 and arranged in a second direction 720, and of first to n-th lines (wherein 'n' is a natural number greater than 1) formed in the second direction 720 and arranged in the first direction 710. Hereinafter, throughout this document, the first to m-th lines may be referred to as first to m-th vertical lines, and the first to n-th lines may be referred to as first to n-th horizontal lines. In an embodiment of the disclosure, the display driver circuitry 230 may obtain a value $y_k$ representing the k-th horizontal line (wherein 'k' is a natural number no less than 1 and no more than m) by respectively applying weights to pixel values of at least some of the pixels of the k-th horizontal line. According to various embodiments of the disclosure, the number of at least some of the pixels of the k-th horizontal line to which the weights are applied may change. For example, for obtaining the value $y_k$, the display driver circuitry 230 may apply the weights respectively to pixel values of i pixels 730 (wherein 'i' is a natural number no less than 1 and less than m) of the k-th horizontal line of the first display area 320, arranged in the second direction 720 from the boundary 410, and apply the weights respectively to pixel values (e.g., $a_{k1}$ to $a_{km}$ shown in FIG. 7) of all pixels 735 of the k-th horizontal line, arranged in the second direction 720 from the boundary 410. Meanwhile, the display driver circuitry 230 may further execute a method of obtaining the value $y_k$ for each of the remaining horizontal lines of the first display area 320 to obtain n values (e.g., $y_1$, $y_2 \ldots, y_k \ldots, y_n$) each representing first to n-th horizontal lines. The display driver circuitry 230 may obtain the second image, based on n values ($y_1, y_2 \ldots, y_k \ldots, y_n$). The display driver circuitry 230 may display the second image in the second display area while displaying the first image in the first display area, based on obtaining the first image. Since the second image is obtained based on the distance between the boundary and each of pixels in the first display area displaying the first image, displaying the second image makes it possible to prevent, or at least minimize or reduce occurrence of the afterimage.

In an embodiment of the disclosure, each of the weights used to obtain the value $y_k$ may be determined depending on the distance between the boundary 410 and each of the pixels of the k-th horizontal line to which the weights are respectively applied. For example, when the pixels 730 are used, the display driver circuitry 230 may obtain the value $y_k$ based on applying a first weight to the first pixel $a_{k1}$ of the k-th horizontal line adjacent to the boundary 410, applying a second weight, being less than the first weight, to the second pixel $a_{k2}$ of the k-th horizontal line adjacent to the first pixel $a_{k1}$ of the k-th horizontal line . . . , and applying an i-th weight, being less than an (i−1)-th weight, to the i-th pixel $a_{k1}$ of the k-th horizontal line. The display driver circuitry 230 may further execute a method of obtaining the value $y_k$ for each of the remaining horizontal lines to obtain n values ($y_1, y_2 \ldots, y_k \ldots, y_n$) each representing the first to n-th horizontal lines of the first display area 320. The display driver circuitry 230 may obtain the second image based on n values ($y_1, y_2 \ldots, y_k \ldots, y_n$). The display driver circuitry 230 may display the second image in the second display area while displaying the first image in the first display area, based on obtaining the second image. Since the second image is obtained based on the distance between the boundary and each of pixels in the first display area displaying the first image, displaying the second image makes it possible to prevent, or at least minimize or reduce occurrence of the afterimage.

In an embodiment of the disclosure, the display driver circuitry 230 may obtain n values ($y_1, y_2 \ldots, y_k \ldots, y_n$) each representing the first to n-th horizontal lines of the first display area 320 using Equation 1 below:

$$y_k = \frac{\sum_{q=1}^{i} w_q a_{kq}}{\sum_{q=1}^{i} w_q} \quad \text{Equation 1}$$

wherein '$y_k$' is a value representing the k-th horizontal line of the first display area 320, '$a_{kq}$' is a pixel value of one pixel of the pixels of the k-th horizontal line of the first display area 320, '$w_q$' is a weight applied to $a_{kq}$, and T is a natural number greater than or equal to 1 and less than or equal to m, which is the number of pixels to which pixel values are respectively referenced in the k-th horizontal line of the first display area 320.

Meanwhile, the display driver circuitry 230 may obtain the second image based on n values ($y_1, y_2 \ldots, y_k \ldots, y_n$) each representing the first to n-th horizontal lines of the first display area 320, based on the Equation 1. The display driver circuitry 230 may display the second image in the second display area while displaying the first image in the first display area, based on obtaining the second image. Since the second image is obtained based on the distance between the boundary and each of pixels in the first display area displaying the first image, displaying the second image makes it possible to prevent occurrence of the afterimage, or at least minimize or reduce the afterimage.

Referring back to FIG. 3A, in order to prevent or at least minimize occurrence of the afterimage in the second display area due to a difference in luminance between horizontal lines in the second display area when the second display area rolled into the housing is exposed out of the housing, the display driver circuitry 230 may further process the values each representing the horizontal lines of the first display area (e.g., values each representing the horizontal lines of the first display area defined through the description of FIG. 7), so as to obtain the second image. In an embodiment of the disclosure, the display driver circuitry 230 may obtain a value representing a first horizontal line of the second display area extending from a first horizontal line of the first display area, based on applying a weight to a value representing the first horizontal line of the first display area among the values, and applying another weight, being less than the weight, to a value representing the second horizontal line of the first display area beneath (or above) the first horizontal line of the first display area among the values. The display driver circuitry 230 may obtain the second image based on the obtained value. The display driver circuitry 230 may display the second image in the second display area while displaying the first image in the first display area, based on obtaining the second image. Since the second image is obtained based on the value representing the first horizontal line of the first display area and the value representing the second horizontal line of the first display area beneath or above the first horizontal line of the first display area, displaying the second image makes it possible to prevent or minimize occurrence of the afterimage in the second display area due to the difference in luminance between the horizontal lines of the second display area when the second display area rolled into the housing is exposed out of the housing.

Figure 8:
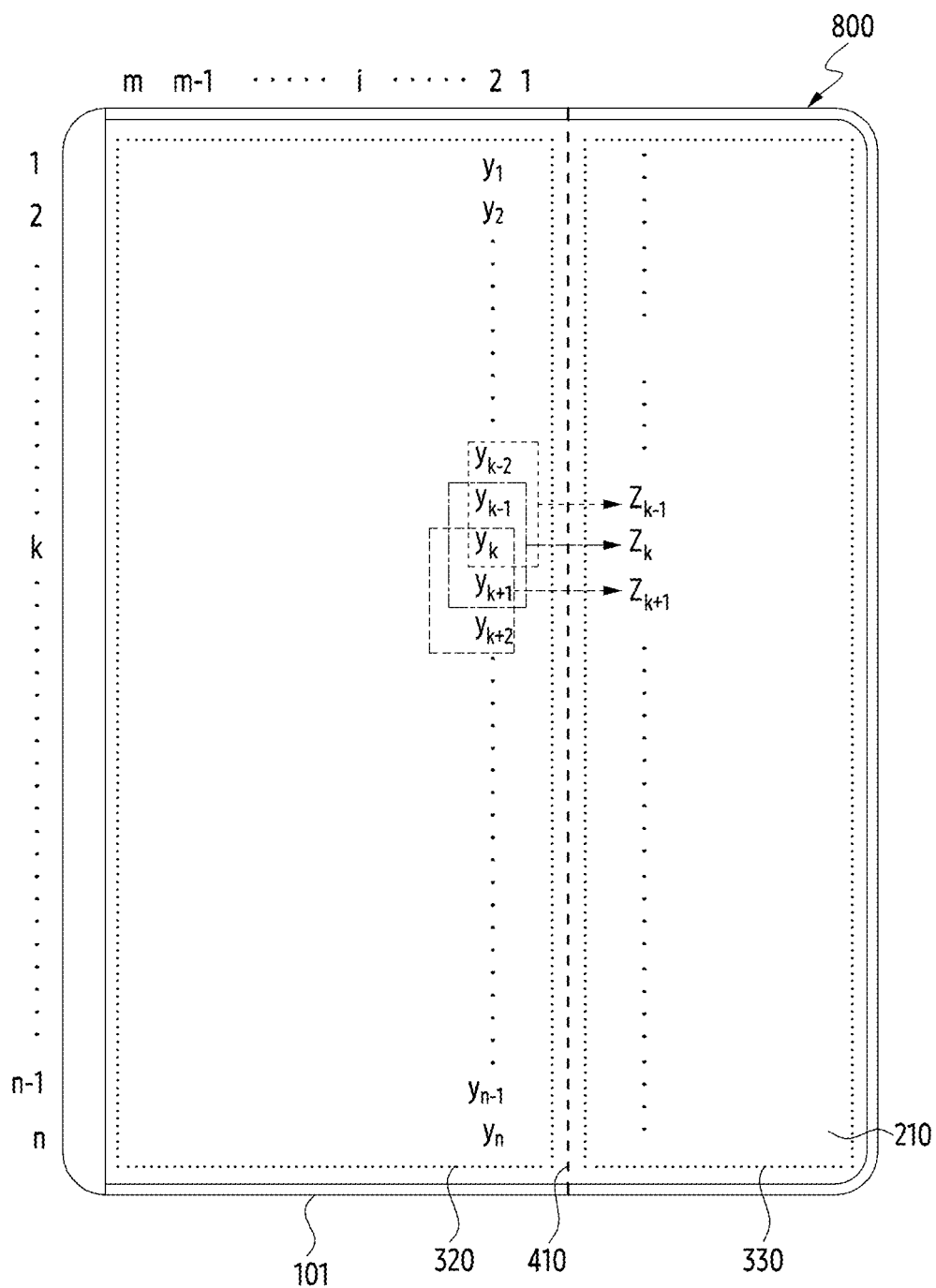
FIG. 8 illustrates obtaining a second image based on pixel values of pixels of each of horizontal lines of a first display area according to an embodiment of the disclosure.

FIG. 8 exemplifies an example of obtaining the second image based on values each representing horizontal lines of the first display area.

FIG. 8 illustrates obtaining a second image based on pixel values of pixels of each of horizontal lines of a first display area according to an embodiment of the disclosure.

Referring to FIG. 8, in the state 800, the display driver circuitry 230 may obtain n values ($y_1, y_2 \ldots, y_k \ldots, y_n$) each representing the first to n-th horizontal lines of the first display area 320, while displaying the first image in the first display area 320 exposed out of the housing. The display driver circuitry 230 may obtain a value $z_k$ representing the k-th horizontal line of the second display area 330 extending from the k-th horizontal line of the first display area 320, based on respectively applying weights to a value $y_k$ representing the k-th horizontal line of the first display area 320 among n values ($y_1, y_2 \ldots, y_k \ldots, y_n$) each representing the first to n-th horizontal lines of the first display area 320, and to values each representing the horizontal lines located within a designated distance from the k-th horizontal line among n values ($y_1, y_2 \ldots, y_k \ldots, y_n$) each representing the first to n-th horizontal lines of the first display area 320. According to embodiments of the disclosure, the designated distance may be changed. For example, in order to obtain the value $z_k$, the display driver circuitry 230 may respectively apply the weights to a value $y_{k-b}$ representing the (k−b)-th horizontal line of the first display area 320 (wherein 'b' is a natural number greater than or equal to 1, and less than or equal to a smaller value of k and n−k) to a value $y_k+b$ representing the (k+b)-th horizontal line of the first display area 320, or may respectively apply the weights to a value $y_{k-c}$ representing the (k–c)-th horizontal line of the first display area 320 (wherein 'c' is a natural number greater than or equal to 1, and less than or equal to a smaller value of k and n-k, but different from b) to a value $y_k$+c representing the (k+c)-th horizontal line of the first display area 320. In an embodiment of the disclosure, each of the weights may change according to a distance between the k-th horizontal line of the first display area 320 and the horizontal line of the first display area 320 corresponding to the horizontal line of the second display area 330 represented by a value to which each of the weights is to be applied. For example, when obtaining the value $z_k$ representing the k-th horizontal line of the second display area 330, the weight applied to the value $y_k$ representing the k-th horizontal line of the first display area 320 may be higher than the weight applied to the value $y_{k-1}$ representing the (k−1)-th horizontal line of the first display area 320. However, it is not limited thereto. In the meantime, the display driver circuitry 230 may further execute a method of obtaining a value $z_k$ for each of the remaining horizontal lines of the first display area 320, so as to obtain n values $(z_1, z_2 \ldots, z_k \ldots, z_n)$ each representing the first to n-th horizontal lines of the second display area 330. The display driver circuitry 230 may obtain the second image based on n values $(z_1, z_2 \ldots, z_k \ldots, z_n)$ each representing the first to n-th horizontal lines of the second display area 330. The display driver circuitry 230 may display the second image in the second display area while displaying the first image in the first display area, based on obtaining the second image. Since the second image is obtained based on the value representing the first horizontal line of the first display area and the value representing the second horizontal line of the first display area beneath or above the first horizontal line of the first display area, displaying of the second image makes it possible to prevent occurrence of the afterimage or at least minimize the afterimage in the second display area due to the difference in luminance between the horizontal lines of the second display area when the second display area rolled into the housing is exposed out of the housing.

In an embodiment of the disclosure, when referring to the values representing each of the horizontal lines of the first display area 320 by three values, the display driver circuitry 230 may obtain n values $(z_1, z_2 \ldots, z_k \ldots, z_n)$ each representing the first to n-th horizontal lines of the second display area 330, based on Equation 2 below:

$$z_k = \frac{ay_{k-1} + by_k + cy_{k+1}}{a+b+c} \qquad \text{Equation 2}$$

wherein '$z_k$' is a value representing the k-th horizontal line of the second display area 330, '$y_k$' is a value representing the k-th horizontal line of the first display area 320, and 'a', 'b', and 'c' each are weights applied to $y_k$.

Meanwhile, the display driver circuitry 230 may obtain the second image based on the n values $(z_1, z_2 \ldots, z_k \ldots, z_n)$ each representing the first to n-th horizontal lines of the second display area 330 obtained using the Equation 2. The display driver circuitry 230 may display the second image in the second display area while displaying the first image in the first display area, based on obtaining the second image. Since the second image is obtained based on the value representing the first horizontal line of the first display area and the value representing the second horizontal line of the first display area beneath or above the first horizontal line of the first display area, displaying of the second image makes it possible to prevent occurrence of the afterimage or at least minimize the afterimage in the second display area due to the difference in luminance between the horizontal lines of the second display area when the second display area rolled into the housing is exposed out of the housing.

Referring back to FIG. 3A, in order to prevent or at least minimize occurrence of the afterimage in the second display area due to the difference in luminance between the pixels in the second display area when the second display area rolled into the housing is exposed out of the housing, the display driver circuitry 230 may further process the values each representing the horizontal lines of the first display area (e.g., values each representing the horizontal lines in the first display area defined through the description of FIG. 7), so as to obtain the second image with a blur effect.

Figure 9A:
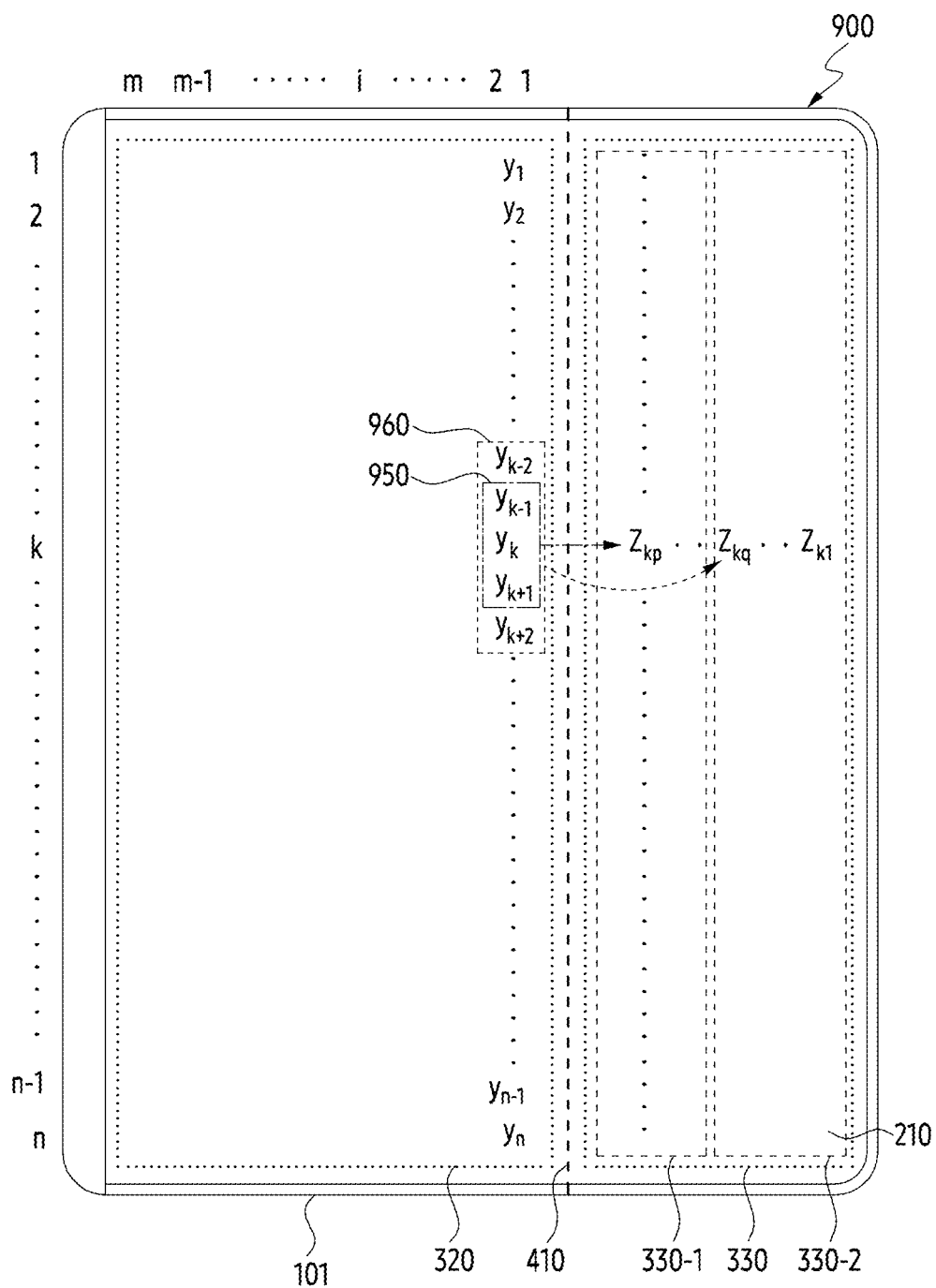
FIG. 9A illustrates changing a number of horizontal lines in a first display area used for adaptively assigning pixel values of pixels of a second display area according to a distance from a boundary between the first display area and the second display area according to an embodiment of the disclosure.
Figure 9B:
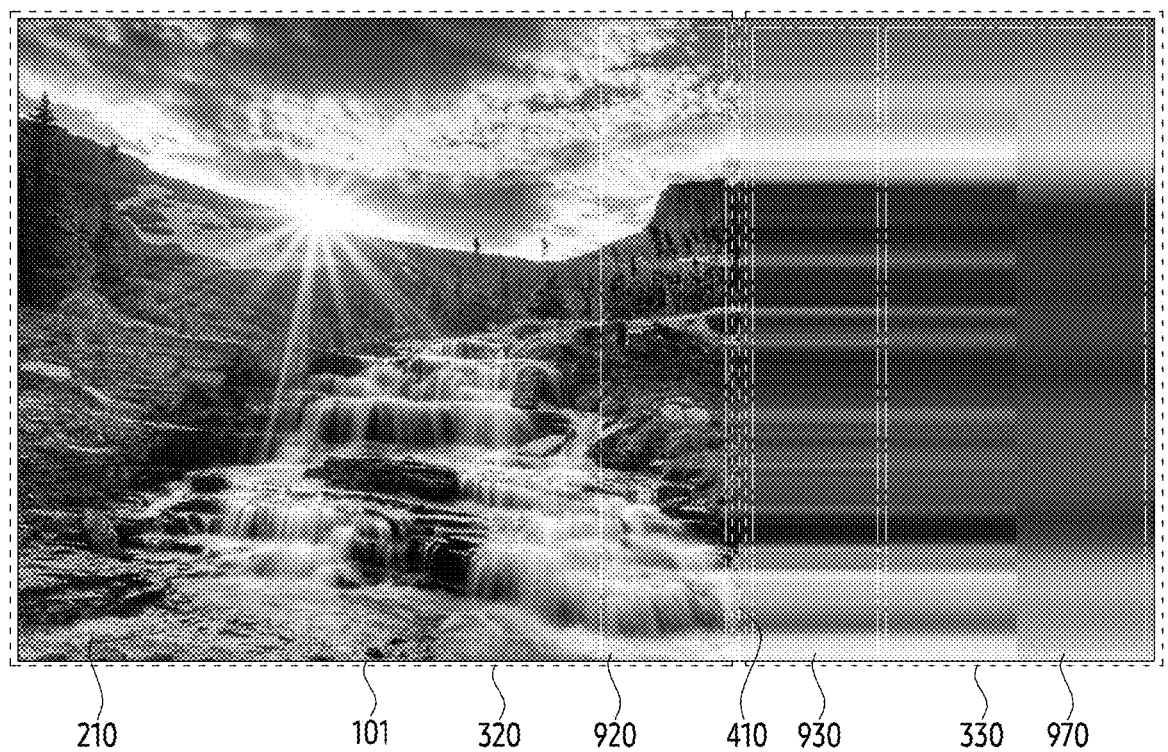
FIG. 9B illustrates a second image having a blur effect according to an embodiment of the disclosure.

FIGS. 9A and 9B each illustrate an example of obtaining the second image having the blur effect and an example of the second image having the blur effect.

FIG. 9A illustrates changing a number of horizontal lines in a first display area used to adaptively assign pixel values of pixels of a second display area according to a distance from a boundary between a first display area and the second display area according to an embodiment of the disclosure.

FIG. 9B illustrates a second image having a blur effect according to one embodiment of the disclosure.

Referring to FIG. 9A, in the state 900, the display driver circuitry 230 may obtain n values $(y_1, y_2 \ldots, y_k \ldots, y_n)$ each representing the first to n-th horizontal lines of the first display area 320, while displaying the first image in the first display area 320 exposed out of the housing. The display driver circuitry 230 may obtain pixel values $(z_{kp}, \ldots)$ of pixels of the k-th horizontal line of a partial area 330-1 of the second display area 330 extending from the k-th horizontal line of the first display area 320, based on applying the weights respectively to a value $y_k$ representing the k-th horizontal line of the first display area 320 among n values $(y_1, y_2 \ldots, y_k \ldots, y_n)$ each representing the first to n-th horizontal lines of the first display area 320, and values (e.g., $y_{k-1}$ and $y_{k+1}$ within an area 950 of FIG. 9A) representing horizontal lines of the first display area 320 located within a first distance from the k-th horizontal line of the first display area 320 among n values $(y_1, y_2 \ldots, y_k \ldots, y_n)$ each representing the first to n-th horizontal lines of the first display area 320. The display driver circuitry 230 may obtain pixel values $(z_{kq}, \ldots, z_{kl})$ of pixels of the k-th horizontal line of a partial area 330-2 of the second display area 330 extending from the k-th horizontal line of the first display area 320, based on applying the weights respectively to a value $y_k$ representing the k-th horizontal line of the first display area 320 among n values $(y_1, y_2 \ldots, y_k \ldots, y_n)$ each representing the first to n-th horizontal lines of the first display area 320, and values (e.g., $y_{k-2}, y_{k-1}, y_{k+1}$, and $y_{k+2}$ in an area 960 of FIG. 9A) representing horizontal lines of the first display area 320 located within a second distance, being greater than the first distance, from the k-th horizontal line of the first display area 320 among n values $(y_1, y_2 \ldots, y_k \ldots, y_n)$ each representing the first to n-th horizontal lines of the first display area 320. The display driver circuitry 230 may display the second image having the blur effect while displaying the first image, based on pixel values of pixels of the k-th horizontal line of the partial area 330-1 of the second display area 330 and pixel values of pixels of the k-th horizontal line of the partial area 330-2 of the second display area 330. For example, referring to FIG. 9B, the second image displayed in the second display area 330 may include a partial image most similar to part of the first image in a partial area 920 of the first display area 320 adjacent to the boundary 410, in the partial area 930 of the second display area 330, and may include a partial image that is more blurred than the partial image in a remaining partial area 970 of the second display area 330. For example, the partial image included in the partial area 930 of the second display area 330 may be obtained based on applying the weights respectively to values (e.g., $y_{k-1}$, $y_k$, and $y_{k+1}$ in FIG. 9A) representing horizontal lines of the first display area 320 associated with the area 950 shown in FIG. 9A, and the blurred partial image included in the partial area 970 of the second display area 330 may be obtained based on applying the weights respectively to values (e.g., $y_{k-2}$, $y_{k-1}$, $y_k$, $y_{k+1}$, and $y_{k+1}$ in FIG. 9A) representing horizontal lines of the first display area 320 associated with the area 960 shown in FIG. 9A. In an embodiment of the disclosure, the partial area 970 of the second display area 330 may include a plurality of partial images in which different blur effects are applied to different locations. For example, part of the partial area 970 spaced apart from the partial area 930 may include a partial image obtained based on applying the weights respectively to $y_1$ to $y_n$ in FIG. 9A, and the remaining part of the partial area 970 between the partial area 930 and part of the partial area 970 may include a partial image obtained based on applying weights respectively to $y_{k-2}$ to $y_{k+2}$ in FIG. 9A. However, it is not limited thereto. Since the second image has a gradual blur effect from the boundary 410, displaying of the second image makes it possible to prevent or at least minimize occurrence of the afterimage in the second display area due to the difference in luminance between the pixels of the second display area when the second display area rolled into the housing is exposed out of the housing.

Referring back to FIG. 3A, in order to prevent or at least minimize occurrence of the afterimage in the second display area due to the difference in luminance between pixels in the second display area when the second display area rolled into the housing is exposed out of the housing, the display driver circuitry 230 may further process the values each representing the horizontal lines of the first display area (e.g., values each representing the horizontal lines in the second display area defined through the description of FIG. 7), so as to obtain the second image. In an embodiment of the disclosure, the display driver circuitry 230 may obtain the second image obtained by gradually changing each of the values until each of the values each representing the horizontal lines of the second display area reaches another value less than the each of the values, the second image having a gradation effect based on a first range of values taking the other value as the minimum value. The display driver circuitry 230 may display the second image in the second display area while displaying the first image in the first display area, based on obtaining the second image. Since the second image has the gradation, displaying of the second image makes it possible to prevent or at least minimize occurrence of the afterimage in the second display area due to the difference in luminance between pixels in the second display area when the second display area rolled into the housing is exposed out of the housing. Further, since the second image has the gradation effect formed based on values smaller than the values each representing horizontal lines of the second display area, it is possible to reduce the electrical power consumed to display the second image in the second display area.

Figure 10A:
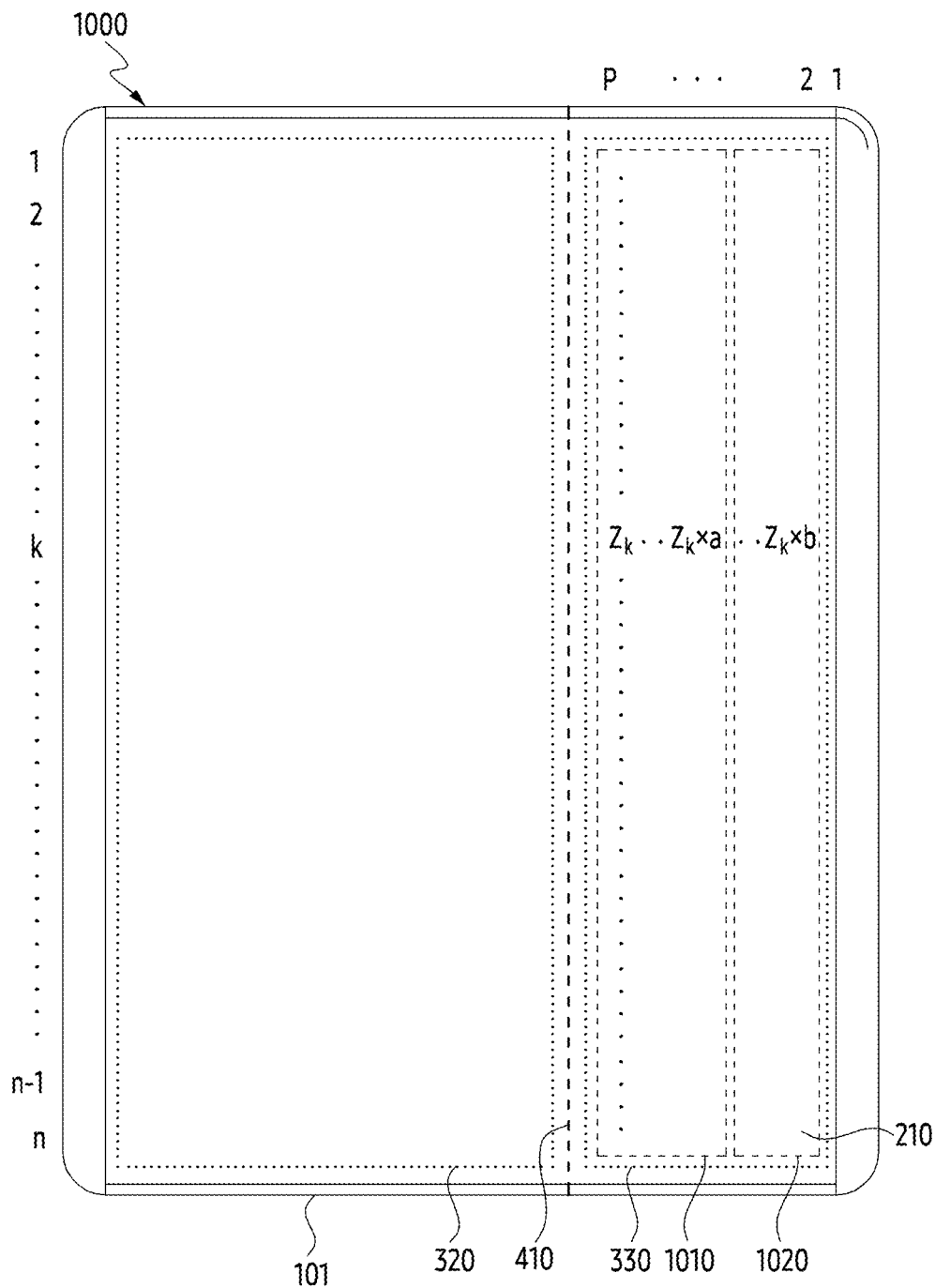
FIG. 10A illustrates obtaining a second image having a gradation effect according to an embodiment of the disclosure.
Figure 10B:
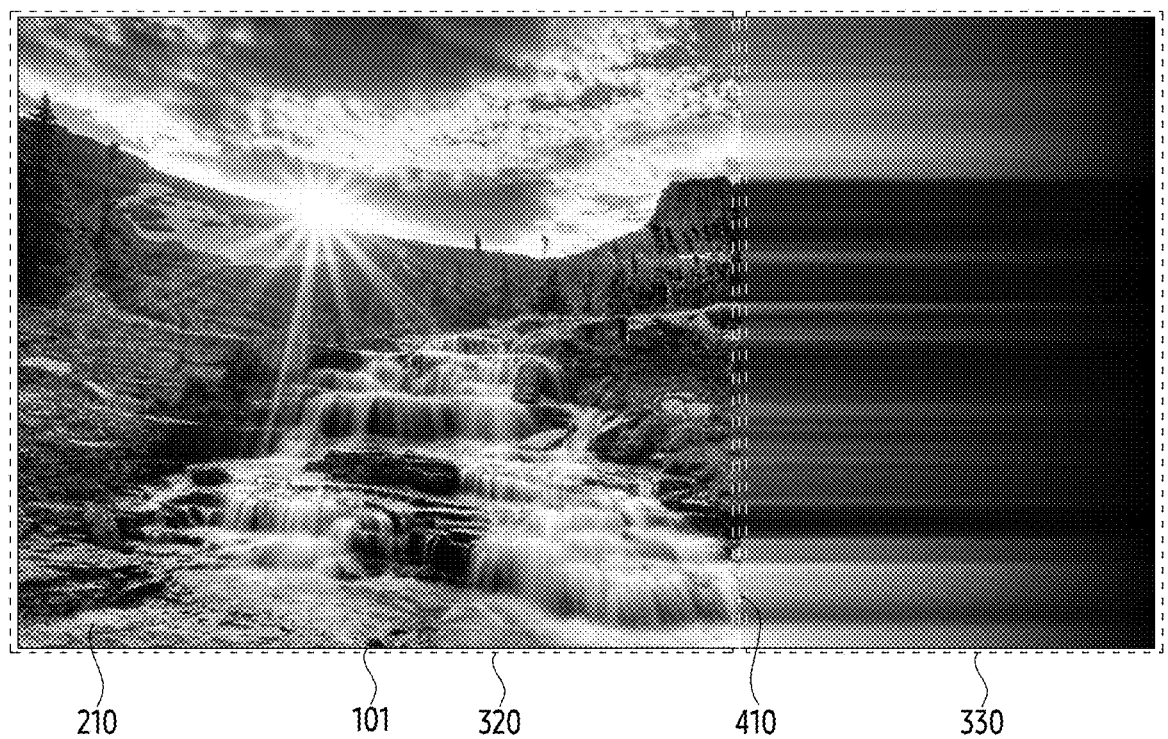
FIG. 10B illustrates a second image having a gradation effect according to an embodiment of the disclosure.

An example of obtaining the second image having the gradation effect and an example of the second image having the gradation effect may be exemplified through FIGS. 10A and 10B.

FIG. 10A illustrates obtaining a second image having a gradation effect according to an embodiment of the disclosure.

FIG. 10B illustrates a second image having a gradation effect according to an embodiment of the disclosure.

Referring to FIG. 10A, in the state 1000, the display driver circuitry 230 may obtain n values ($z_1$, $z_2$, . . . , $z_k$, . . . , $z_n$) each representing the first to n-th horizontal lines of the second display area 330 while displaying the first image in the first display area 320 exposed out of the housing. The display driver circuitry 230 may obtain values between a value $z_k$ representing the k-th horizontal line of the second display area 330 among the n values ($z_1$, $z_2$, . . . , $z_k$, . . . , $z_n$) each representing the first to n-th horizontal lines of the second display area 330 and a value ($z_k \times a$) less than the value $z_k$ (wherein 'a' is a real number greater than or equal to 0 and less than 1) as pixel values of pixels of the k-th horizontal line (e.g., pixel values of pixels included in a partial area 1010 among first to p-th pixels of the k-th horizontal line of the second display area 330), and obtain values between the value ($z_k \times a$) and a value ($z_k \times b$) (wherein, 'b' is a real number greater than or equal to 'a' and less than 1) as pixel values of pixels of the k-th horizontal line of a partial area 1020 of the second display area (e.g., pixel values of pixels included in the partial area 1020 among first to p-th pixels of the k-th horizontal line of the second display area 330). The display driver circuitry 230 may display the second image in the second display area 330 while displaying the first image in the first display area 320, based on the pixel values of pixels of k-th horizontal line of the partial area 1010 of the second display area 330 and the pixel values of pixels of k-th horizontal line of the partial area 1020 of the second display area 330.

Referring to FIG. 10B, since the second image displayed in the second display area 330 is obtained based on the distance between the boundary 410 and each of the pixels in the first display area 320 displaying the first image, the synthesis between the vertical lines of the first display area 320, and the gradation effect, it is possible to prevent, minimize or reduce occurrence of the afterimage in the vicinity of the boundary 410 and in the second display area 330.

Referring back to FIG. 3A, in order to reduce electrical power consumed to display the second image in the second display area rolled into the housing, and prevent, minimize, or at least reduce occurrence of the afterimage, the display driver circuitry 230 may display the second image having multiple gradation effects in the second display area. In an embodiment of the disclosure, the display driver circuitry 230 may obtain a first range of values by sequentially changing each of the values until each of the values each representing the horizontal lines of the second display area (e.g., values each representing the horizontal lines of the second display area defined through the description of FIG. 8) reaches a value less than the each of the values, and obtain a second range of values by sequentially changing a minimum value among the first range of values until it reaches a value higher than the minimum value. The display driver circuitry 230 may apply the first range of values to a first partial area in the second display area (e.g., an area extending from a vertical line 1050 to a vertical line 1060 of FIG. 10C) and apply the second range of values to a second partial area in the second display area adjacent to the first partial area in the second display area (e.g., an area extending from the vertical line 1060 to a vertical line 1070 of FIG. 10C), thereby displaying the second image having a first gradation effect in the first partial area within the second display area and a second gradation effect in the second partial area within the second display area.

An example of obtaining the second image having the plurality of gradation effects and an example of the second image having the plurality of gradation effects may be illustrated with reference to FIG. 10C.

Figure 10C:
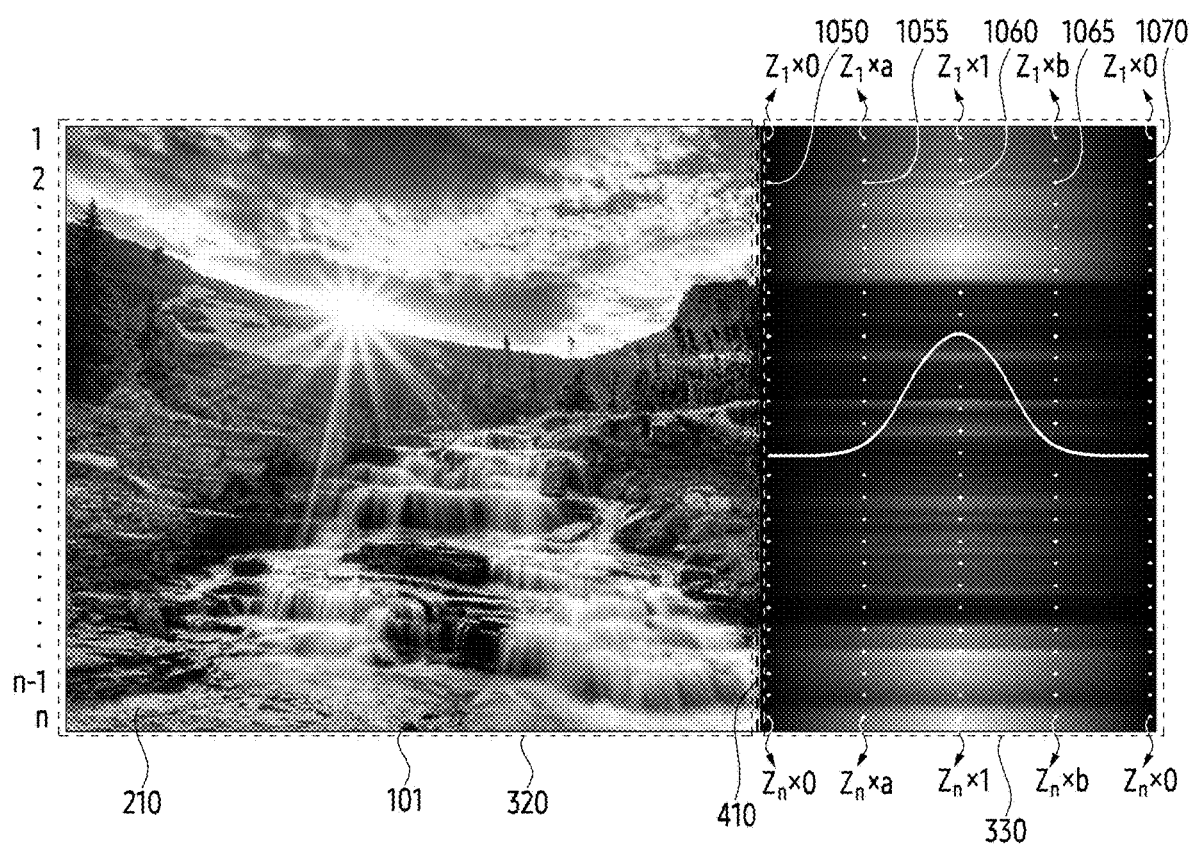
FIG. 10C illustrates a second image having multiple gradation effects according to an embodiment of the disclosure.

FIG. 10C illustrates a second image with multiple gradation effects according to an embodiment of the disclosure.

Referring to FIG. 10C, the display driver circuitry 230 may display the second image having multiple gradation effects in the second display area 330, based on assigning pixel values of pixels in a vertical line 1050 of the second display area 330 adjacent to the boundary 410 to values ($z_1 \times 0$ to $z_n \times 0$) (wherein $z_1$ to $z_n$ are values representing each of first to n-th horizontal lines of the second display area 330), assigning pixel values of pixels in a vertical line 1055 of the second display area 330 to values ($z_1 \times a$ to $z_n \times a$) ('a' is a real number greater than 0 and less than 1), assigning pixel values of pixels in a vertical line 1060 of the second display area 330 to values ($z_1 \times 1$ to $z_n \times 1$), assigning pixel values of pixels in a vertical line 1065 of the second display area 330 to values ($z_1 \times b$ to $z_n \times b$) (wherein 'b' is a real number greater than 0 and less than 1), and assigning pixel values of pixels in a vertical line 1070 of the second display area 330 to values ($z_1 \times 0$ to $z_n \times 0$). Since the second image has the multiple gradation effects, it is possible to reduce the electrical power consumed to display the second image, and prevent, minimize or at least reduce occurrence of the afterimage.

Referring again to FIG. 3A, the display driver circuitry 230 may obtain the second image by executing another operation distinct from the above-described operations to prevent or at least reduce the occurrence of the afterimage, and may display the second image in the second display area rolled into the housing, while displaying the first image in the first display area exposed out of the housing.

An example of the aforementioned other operation may be exemplified with reference to FIGS. 11 to 14.

Figure 11:
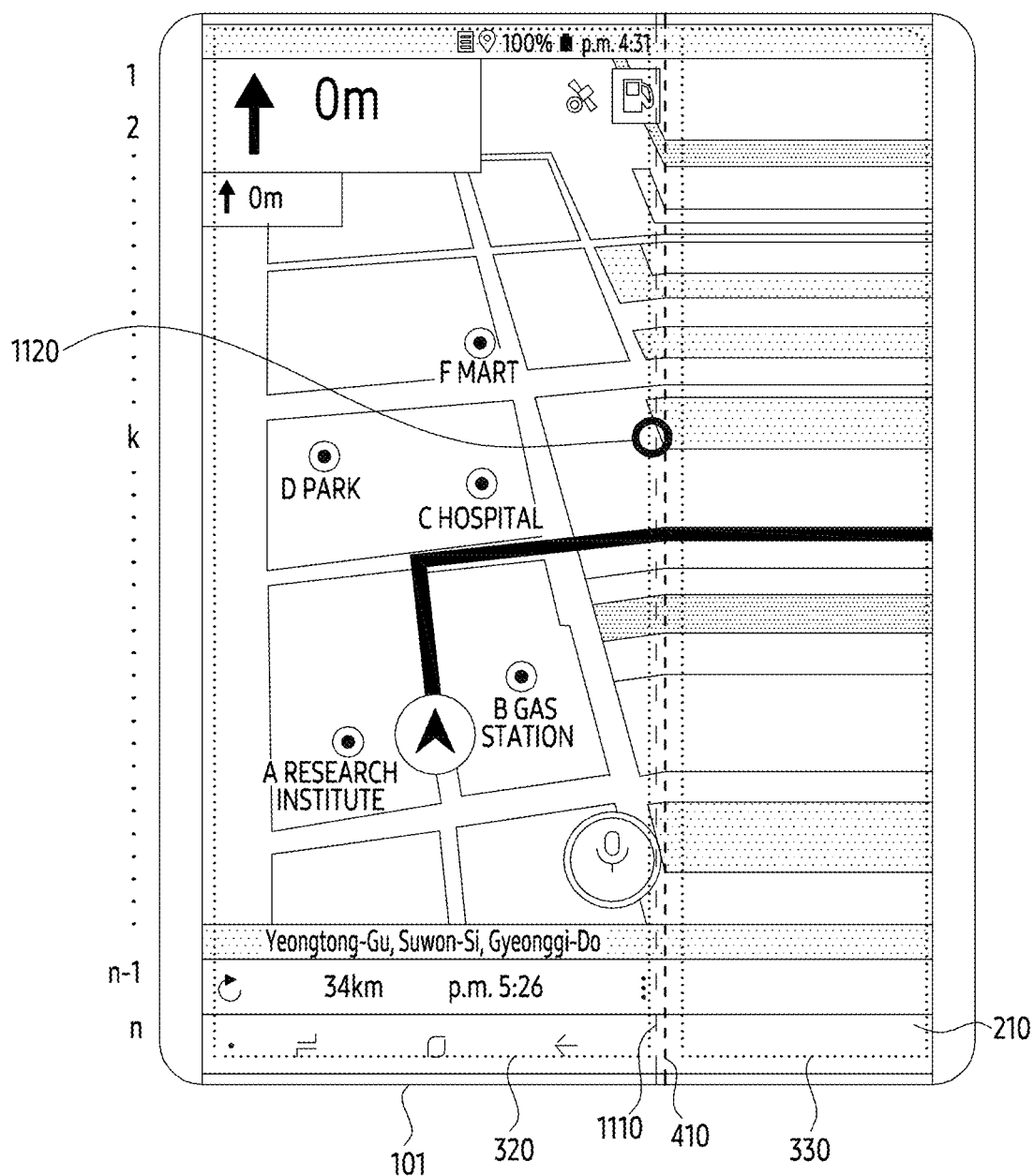
FIG. 11 illustrates obtaining a second image based on pixel values of pixels of a first display area adjacent to a boundary according to an embodiment of the disclosure.

FIG. 11 illustrates a obtaining a second image based on pixel values of pixels in a first display area adjacent to a boundary according to an embodiment of the disclosure.

Figure 12:
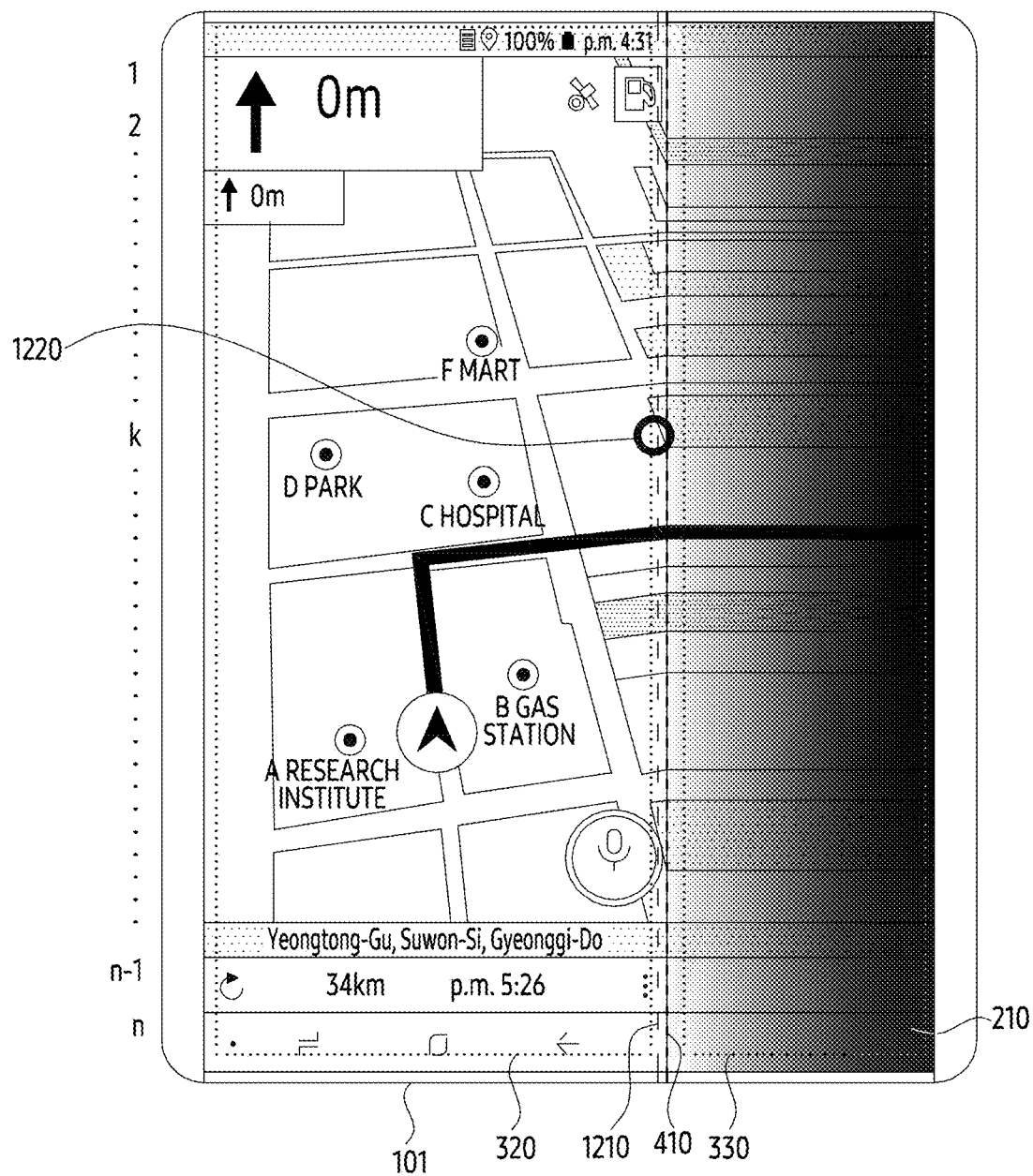
FIG. 12 illustrates obtaining a second image having a gradation effect based on pixel values of pixels of a first display area adjacent to a boundary according to an embodiment of the disclosure.

FIG. 12 illustrates obtaining a second image having gradation effect based on pixel values of pixels of a first display area adjacent to a boundary according to an embodiment of the disclosure.

Figure 13:
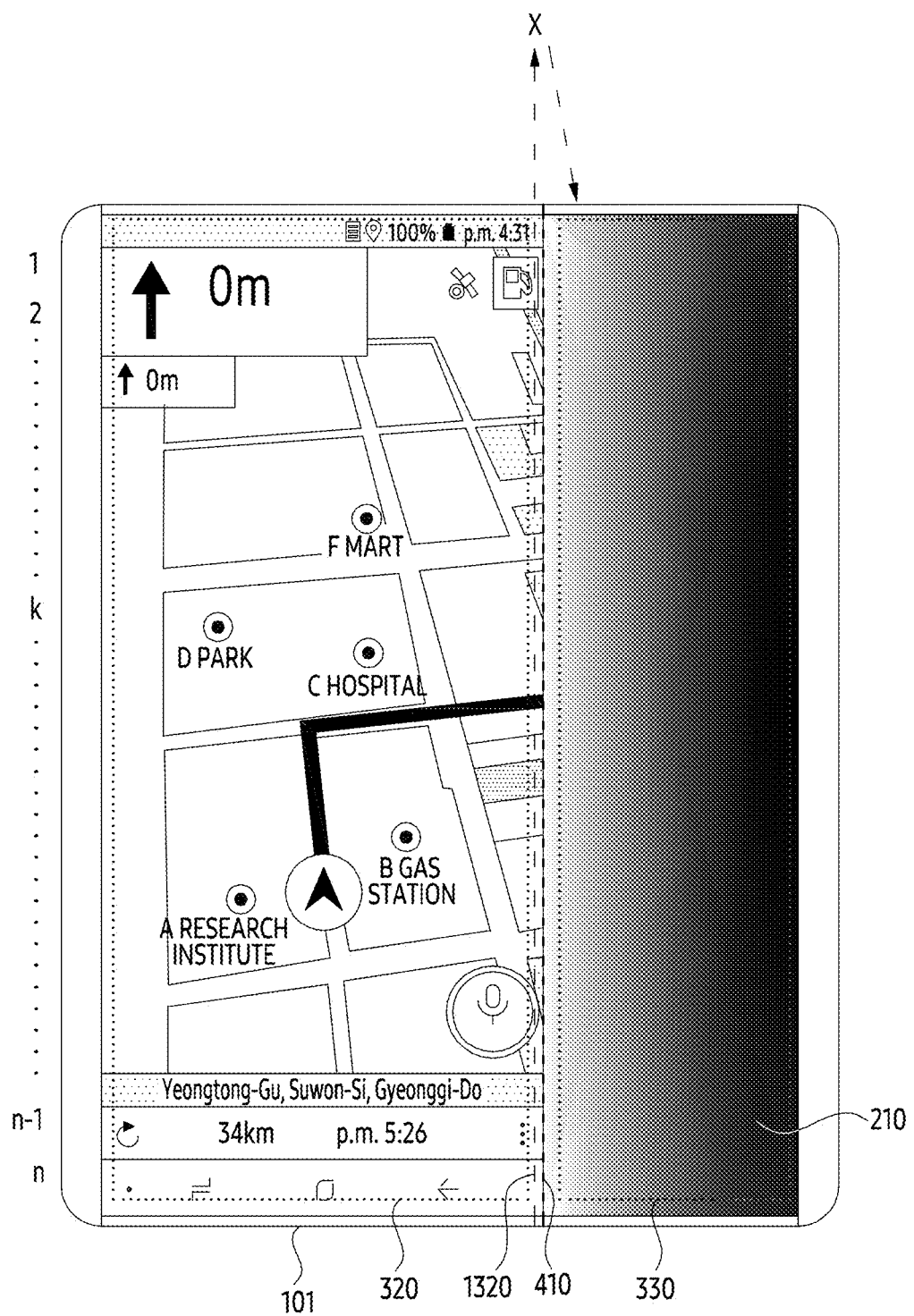
FIG. 13 illustrates obtaining a second image having a gradation effect based on an average value of pixel values of pixels of a first display area adjacent to a boundary according to an embodiment of the disclosure.

FIG. 13 illustrates obtaining a second image having a gradation effect based on an average value of pixel values of pixels in a first display area adjacent to a boundary according to an embodiment of the disclosure.

Figure 14:
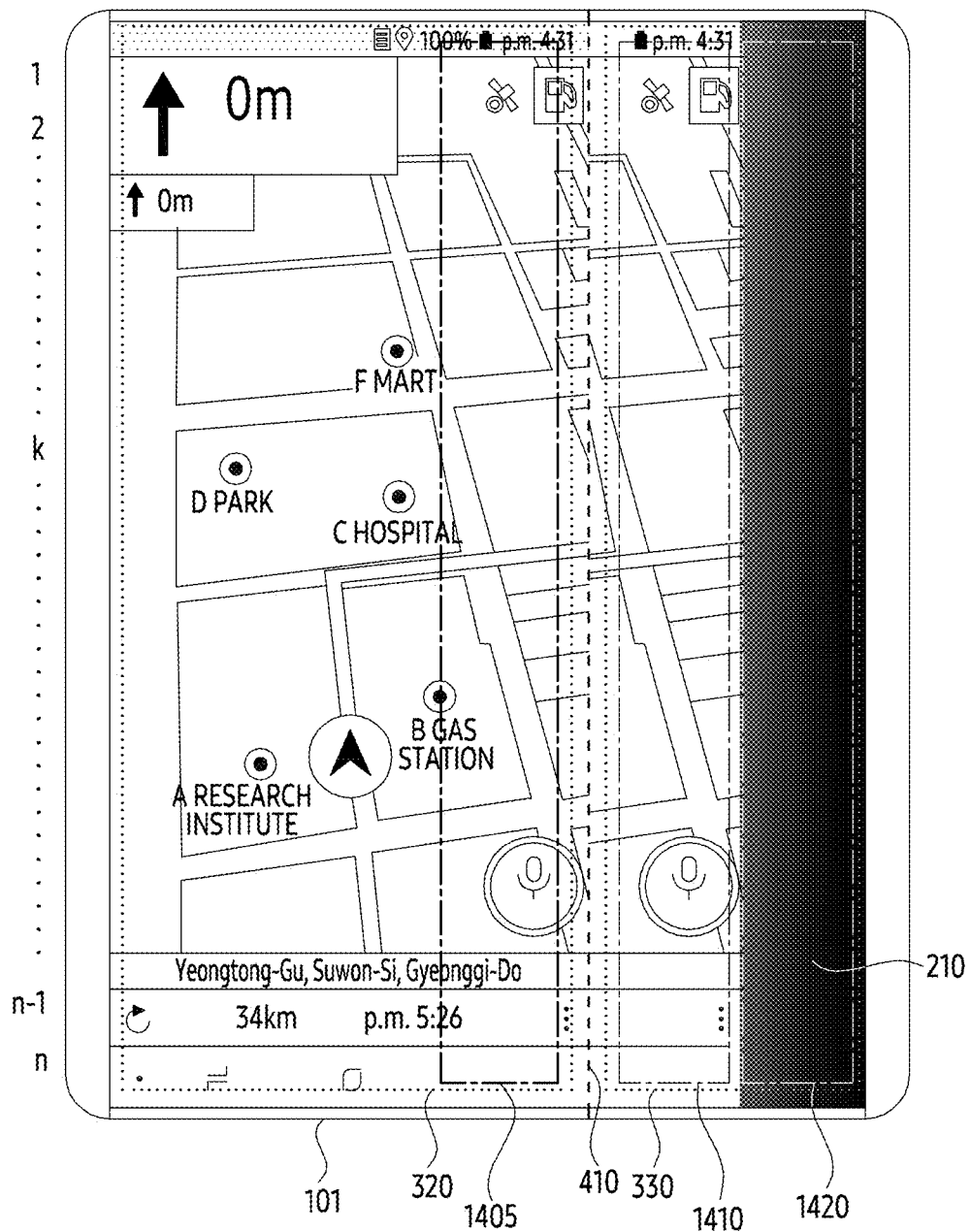
FIG. 14 illustrates obtaining a second image including an image displayed in a partial area of a first display area adjacent to a boundary in a partial area of a second display area adjacent to the boundary according to an embodiment of the disclosure.

FIG. 14 illustrates obtaining a second image including an image displayed in a partial area of a first display area adjacent to a boundary, in a partial area of a second display area adjacent to the boundary according to an embodiment of the disclosure.

Referring to FIG. 11, the display driver circuitry 230 may obtain pixel values of pixels in a vertical line 1110 of the first display area 320 adjacent to a boundary 410 between the first display area 320 and the second display area 330 rolled into the housing, while displaying the first image in the first display area 320 exposed out of the housing. The display driver circuitry 230 may display the second image in the second display area 330 while displaying the first image in the first display area 320, based on setting pixel values of pixels of k-th horizontal line of the second display area 330 extending from k-th horizontal line of the first display area 320 to a pixel value 1120 of k-th horizontal line of the display area 320 among the obtained pixel values. Since the second image is obtained based on pixel values of pixels of the vertical line 1110 of the first display area 320 adjacent to the boundary 410, displaying of the second image makes it possible to prevent, minimize, or reduce occurrence of the afterimage in the vicinity of the boundary 410.

Referring to FIG. 12, the display driver circuitry 230 may obtain pixel values of pixels in the vertical line 1210 of the first display area 320 adjacent to the boundary 410 between the first display 320 and the second display area 330 rolled into the housing, while displaying the first image in the first display area 320 exposed out of the housing. The display driver circuitry 230 may set a pixel value of a pixel adjacent to the boundary 410 among pixels of k-th horizontal line of the second display area 330 extending from k-th horizontal line of the first display area 320, to a pixel value 1220 of k-th horizontal line of the first display area 320 among the obtained pixel values. The display driver circuitry 230 may obtain the second image based on applying the gradation effect using values between the pixel value 1220 and a value less than the pixel value 1220. The display driver circuitry 230 may display the second image in the second display area 330 while displaying the first image in the first display area 320, based on obtaining the second image. Since the second image is obtained based on applying of the pixel values of the pixels in the vertical line 1110 of the first display area 320 adjacent to the boundary 410 and applying the gradation effect, displaying of the second image makes it possible to prevent, minimize, or reduce occurrence of the afterimage in the vicinity of boundary 410.

Referring to FIG. 13, while displaying the first image in the first display area 320 exposed out of the housing, the display driver circuitry 230 may obtain pixel values of pixels in a vertical line 1320 of the first display area 320 adjacent to the boundary 410, and obtain an average value X of the pixel values. The display driver circuitry 230 may obtain the second image based on applying the gradation effect using values between the average value X and a value less than the average value. The display driver circuitry 230 may display the second image in the second display area 330 while displaying the first image in the first display area 320, based on obtaining the second image. Since the second image is obtained based on applying the average value X of the pixel values of the pixels in the vertical line 1320 of the first display area 320 adjacent to the boundary 410 and applying the gradation effect, displaying of the second image makes it possible to prevent, minimize, or reduce the occurrence of the afterimage in the vicinity of the boundary 410.

Referring to FIG. 14, while displaying the first image in the first display area 320 exposed out of the housing, the display driver circuitry 230 may obtain part of the first image in a partial area 1405 of the first display area 320 as part of the second image to be displayed in a partial area 1410 of the second display area 330. The display driver circuitry 230 may obtain a remaining part of the second image to be displayed in a remaining partial area 1420 of the second display area 330, based on the method defined through the description of FIG. 7, 8, 9A, 10A, 12, or 13, while displaying the first image in the first display area 320 exposed out of the housing. The display driver circuitry 230 may display the obtained part of the second image in the partial area 1410 of the second display area 330 and display the obtained remaining part of the second image in the remaining partial area 1420 of the second display area 330, while displaying the first image in the first display area 320, based on obtaining the part of the second image and the remaining part of the second image. Since the part of the second image is the same as the part of the first image in the partial area 1405 of the first display area 320, displaying of the part of the second image makes it possible to prevent, minimize, or reduce occurrence of afterimage. In addition, since the remaining part of the second image is configured with an image similar to, but not identical to, the part of the second image, displaying of the remaining part of the second image makes it possible to prevent, minimize, or reduce occurrence of the afterimage in the second display area.

Referring back to FIG. 3A, in an embodiment of the disclosure, when the first image displayed in the first display area exposed out of the housing of the electronic device 101 is switched to a third image following the first image, the display driver circuitry 230 may perform a processing of the second image displayed in the second display area rolled into the housing of the electronic device 101, based on comparison between first values to represent horizontal lines of the second display area (or first values to represent horizontal lines of the first display area, or first values to represent pixel values of the second display area displaying the second image), the first values being obtained while obtaining the second image, and second values to represent horizontal lines of the second display area (or second values to represent horizontal lines of the first display area, or second values to represent pixel values of the second display area obtained based on the third image), the second values being obtained by executing at least one of the operations illustrated through the description of FIG. 7, 8, 9A, 10A, or 11 to 14 based on the third image. The display driver circuitry 230 may perform the processing of the second image when the first image is switched to the third image, in order to reduce the power consumed in switching the second image displayed in the second display area rolled into the housing, to another image.

For example, the display driver circuitry 230 may identify each of the difference values between each of the first values and each of the second values for each horizontal line of the second display area. In response to the identification, the display driver circuitry 230 may change pixel values of pixels in at least one horizontal line of the second display area having a difference equal to or greater than a reference value among the difference values to some of the second values corresponding to pixel values of pixels in the at least one horizontal line, and maintain pixel values of pixels of a remaining horizontal line of the second display area having a difference less than the reference value, thereby at least partially changing the second image displayed in the second display area rolled into the housing, while displaying the third image.

As another example, the display driver circuitry 230 may identify each difference value between each of the first values and each of the second values for each horizontal line of the second display area. In response to the identification, the display driver circuitry 230 may identify the number of at least one horizontal line of the second display area having a difference equal to or greater than the reference value among the difference values, change the second image displayed in the second display area rolled into the housing while displaying the third image, into a fourth image obtained based on the second values, based on identifying that the identified number is equal to or greater than a predetermined number, and maintain displaying the second image in the second display area rolled into the housing while displaying the third image, based on identifying that the identified number is less than the predetermined number.

As described above, the electronic device 101 may display the second image switched from the first image in the second display area of the display 210 rolled into the housing while displaying the first image in the first display area of the display 210, and having properties corresponding to the properties of the first image, so that when the second display of the display 210 rolled into the housing is exposed out of the housing, it is possible to prevent, reduce, or minimize occurrence of the afterimage in the vicinity of the boundary between the first display area and the second display area. In an embodiment of the disclosure, the electronic device 101 may reduce the electrical power consumed in obtaining the second image, by reducing at least one of the number of operations required to obtain the second image or the complexity of those operations. In an embodiment of the disclosure, the electronic device 101 may display the second image, to which a visual effect (e.g., blur effect or gradation effect) is applied, in the second display area, so that it is possible to reduce the difference in luminance between pixels within the second display area and reduce the electrical power consumed for displaying an image.

Figure 15:
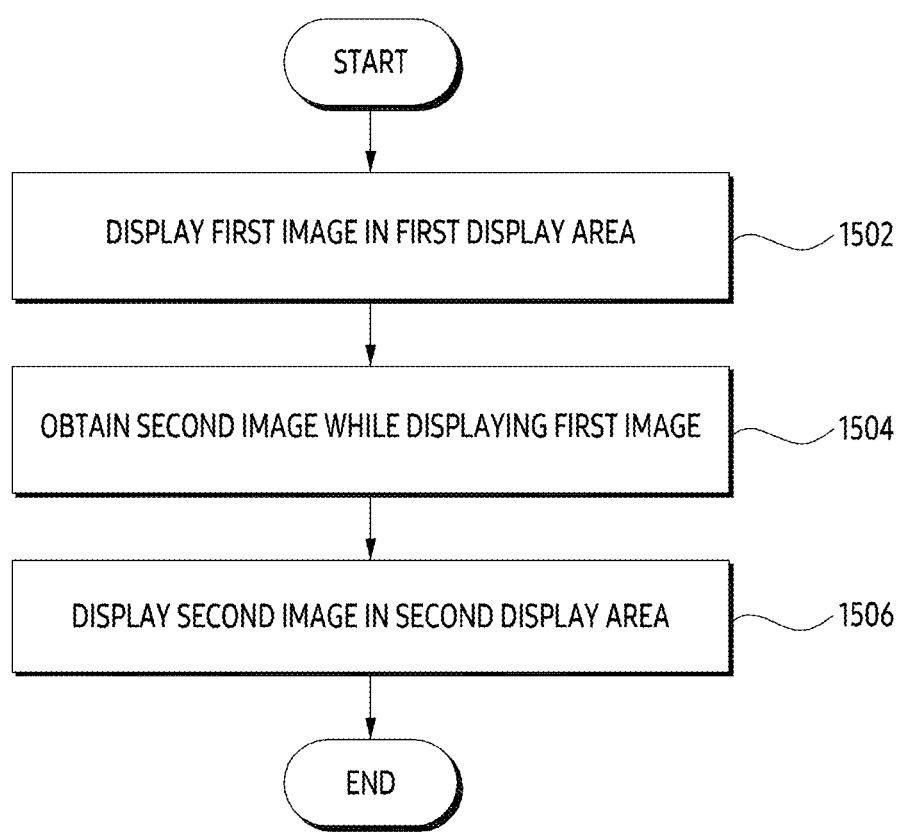
FIG. 15 is a flowchart illustrating a method of displaying a second image switched from a first image in a display area rolled into a housing of an electronic device according to an embodiment of the disclosure.

FIG. 15 is a flowchart illustrating a method of displaying a second image switched from a first image in a display area rolled into a housing of an electronic device according to an embodiment of the disclosure.

This method may be performed with the electronic device 101 shown in FIG. 1, the electronic device 101 shown in FIG. 3A, the processor 120 of the electronic device 101, or the display driver circuitry 230 shown in FIG. 3A.

Referring to FIG. 15, in operation 1502, the display driver circuitry 230 may display the first image in the exposed first display area, while the first display area of the electronic device 101 is exposed and the second display area of the display 210 is in a first state rolled into the housing of the electronic device 101. For example, the first image may be an image obtained by the processor 120, and provided from the processor 120 to the display driver circuitry 230. In an embodiment of the disclosure, the first image may be an image obtained through an application stored in the electronic device 101. However, it is not limited thereto. In an embodiment of the disclosure, the first image may be an image obtained by the display driver circuitry 230. For example, the first image may be an image obtained by the display driver circuitry 230, based on data stored in an internal memory of the display driver circuitry 230. However, it is not limited thereto.

In an embodiment of the disclosure, the display driver circuitry 230 may provide a black image in the second display area rolled into the housing, while displaying the first image in the first display area. For example, the black image may be an image consisting of black in the whole area. However, it is not limited thereto.

In operation 1504, while displaying the first image in the first display area exposed out of the housing, the display driver circuitry 230 may obtain the second image, based on applying a first weight to a pixel value of a first pixel in a first horizontal line of the first display area spaced apart by a first distance from the boundary between the first display area and the second display area, and applying a second weight, being less than the first weight, to a pixel value of a second pixel in the first horizontal line of the first display area spaced apart by a second distance from the boundary, the second distance being greater than the first distance. For example, while displaying the first image, the display driver circuitry 230 may get pixel values of pixels disposed relatively closer from the boundary to be more reflected into the second image to be displayed in the second display area rolled into the housing, than pixel values of pixels disposed relatively farther from the boundary, so that it is possible to obtain the second image to prevent or reduce occurrence of the afterimage that might be caused at the boundary or around the boundary. In an embodiment of the disclosure, the second image may be obtained to reduce the difference in voltage between a gate-source voltage of a driving transistor for each of pixels of the first display area adjacent to the boundary and a gate-source voltage of a driving transistor for each of pixels of the second display adjacent to the boundary. In an embodiment of the disclosure, the second image may be obtained to prevent or reduce occurrence of the afterimage in vertical lines of the second display area parallel to the boundary between the first display area and the second display area. However, it is not limited thereto.

In operation 1506, in response to obtaining the second image, the display driver circuitry 230 may display the second image in the second display area rolled into the housing, while displaying the first image in the first display area. According to one embodiment of the disclosure, when the black image is displayed together with the first image in operation 1502, the display driver circuitry 230 may switch the black image displayed in the second display area to the second image, so as to display the second image in the second display area.

As described above, the electronic device 101 may display the second image in the second display area rolled into the housing, for compensating for the afterimage that may be caused when the second display area rolled into the housing is exposed out of the housing, using at least part of the first image, thereby further enhancing the usability and the visibility of the electronic device 101.

Figure 16:
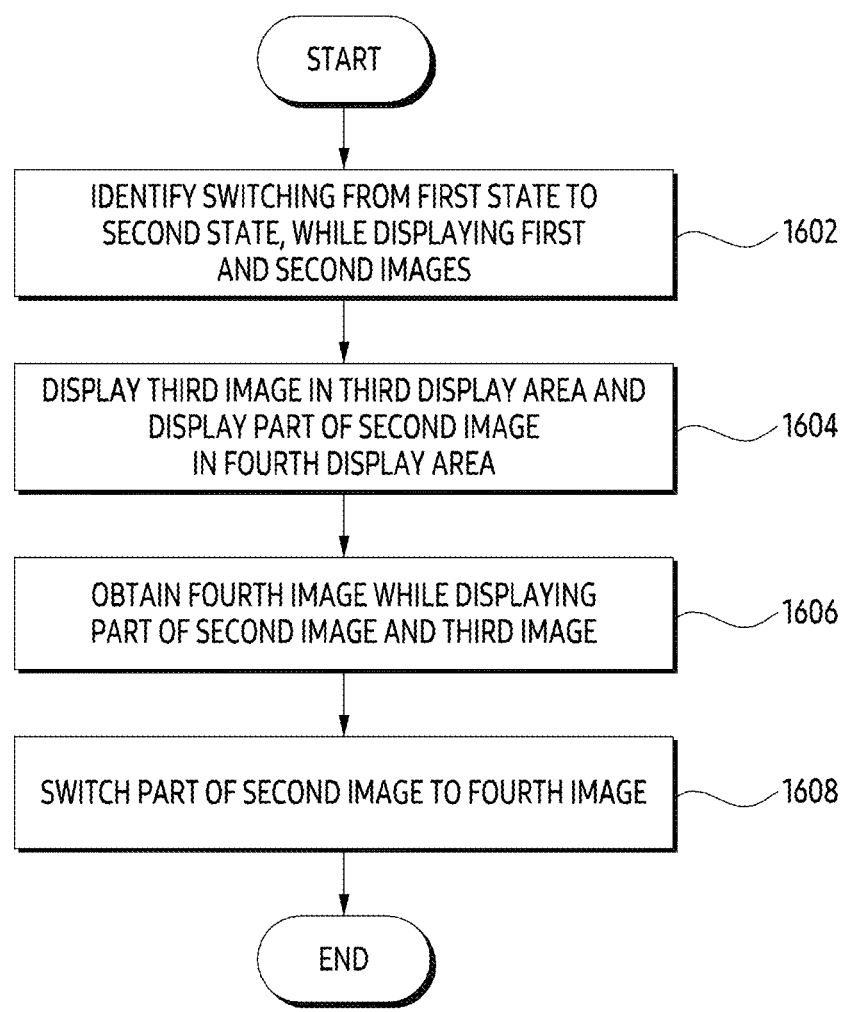
FIG. 16 is a flowchart illustrating a method of switching an image displayed in a display area rolled into a housing based on a change in a size of the display area exposed out of the housing of the electronic device according to an embodiment of the disclosure.

FIG. 16 is a flowchart illustrating a method of switching an image displayed in a display area rolled into a housing, based on a change in a size of a display area exposed out of the housing of the electronic device, according to an embodiment of the disclosure.

This method may be carried out by the electronic device 101 shown in FIG. 1, the electronic device 101 shown in FIG. 3A, the processor 120 of the electronic device 101, or the display driver circuitry 230 shown in FIG. 3A.

Operations 1602 to 1608 set forth in FIG. 16 may be related to the operation 1506 of FIG. 15.

Referring to FIG. 16, in operation 1602, while displaying the first image in the first display area exposed out of the housing of the electronic device 101 and displaying the second image in the second display area rolled into the housing, the display driver circuitry 230 may identify switching from the first state in which the first display area is exposed out of the housing and the second display area is rolled into the housing, to the second state in which at least part of the second display area rolled into the housing is exposed. In an embodiment of the disclosure, the processor 120 may obtain data to indicate switching from the first state to the second state, via at least one sensor in the electronic device 101 configured to identify switching from the first state to the second state or from the second state to the first state. The data may include information on a size of at least part of the second display area exposed out of the housing due to the switching from the first state to the second state. However, it is not limited thereto. In an embodiment of the disclosure, in response to obtaining the data, the processor 120 may provide a signal to indicate to the display driver circuitry 230 that the at least part of the second display area rolled into the housing is exposed out of the housing. The signal may be distinguished from data for displaying an image (e.g., data for displaying the first image) provided from the processor 120 to the display driver circuitry 230. The display driver circuitry 230 may identify the switching from the first state to the second state, based on obtaining the signal from the processor 120. In another embodiment of the disclosure, in response to receiving the data, the processor 120 may provide the display driver circuitry 230 with data for displaying an image in a third display area, including the first display area exposed out of the housing and at least part of the second display area exposed out of the housing by the switching. The display driver circuitry 230 may obtain the data from the processor 120. The display driver circuitry 230 may identify the size of the third display area indicated by the data, and identify switching from the first state to the second state based on the identified size of the third display area. However, it is not limited thereto.

In operation 1604, in response to the identification, the display driver circuitry 230 may display a third image in the third display area exposed out of the housing, and display a part of the second image in a fourth display area that is a remaining part of the second display area rolled into the housing. For example, since the third image is an image displayed in the third display area having a size larger than that of the first display area, the third image may be an image having more enlarged size than the first image displayed in the first display area in the operation 1602. For example, in an embodiment of the disclosure, assuming that the first image is of a user interface of a first application, being provided from the first application installed in the electronic device 101 and including at least one executable object for a service provided through the first application in a first arrangement, the third image may include an expanded user interface of the first application or an extended user interface of the first application. In an embodiment of the disclosure, the third image may include the at least one executable object disposed in a second arrangement distinct from the first arrangement. In an embodiment of the disclosure, the third image may include the at least one executable object having an enlarged size. In an embodiment of the disclosure, the third image may further include at least one other executable object distinct from the at least one executable object, which is not included in the first image. However, it is not limited thereto.

In operation 1606, the display driver circuitry 230 may obtain a fourth image based on the third image while displaying a part of the second image and the third image. For example, although the first image and the third image are images provided by the same application (e.g., the first application), the display driver circuitry 230 may obtain the fourth image based on the third image, while displaying the part of the second image and the third image, because gate-source voltage of driving transistors for each of pixels in the first display area used to display the first image may different from gate-source voltage of driving transistors for each of pixels in the third display area used to display the third image. For example, the display driver circuitry 230 may obtain the fourth image, based on applying a third weight to a pixel value of a first pixel of a first horizontal line of the third display area spaced apart by a first distance from a boundary between the third display area and the fourth display area, and applying a fourth weight, being less than the third weight, to a pixel value of a second pixel of the first horizontal line of the third display area spaced apart by a second distance, being greater than the first distance, from the boundary. For example, while displaying the third image, the display driver circuitry 230 may get pixel values of pixels disposed relatively closer from the boundary between the third display area and the fourth display area to be more reflected into the fourth image to be displayed in the fourth display area rolled into the housing, than pixel values of pixels disposed relatively farther from the boundary, thereby obtaining the fourth image to prevent or at least reduce occurrence of the afterimage that may be caused at the boundary or around the boundary. In an embodiment of the disclosure, the fourth image may be obtained to reduce the difference in voltage between a gate-source voltage of a driving transistor for each of the pixels of the third display area adjacent to the boundary and a gate-source voltage of a driving transistor for each of the pixels of the fourth display area adjacent to the boundary. In an embodiment of the disclosure, the fourth image may be obtained to prevent or at least reduce occurrence of the afterimage in vertical lines in the fourth display area parallel to the boundary between the third display area and the fourth display area. However, it is not limited thereto.

In operation 1608, in response to obtaining the fourth image, the display driver circuitry 230 may switch part of the second image displayed in the fourth display area rolled into the housing, to the fourth image, so as to display the third image in the third display area and display the fourth image in the fourth display area.

As described above, the electronic device 101 may identify a change in size of the display area exposed out of the housing, and in response to the identification, obtain an image to compensate for the afterimage that might be caused in the boundary between the display area having the changed size and the display area rolled into the housing or in the vicinity of the boundary. The electronic device 101 may display the image in the display area rolled into the housing to enhance usability and visibility of the electronic device 101.

Figure 17:
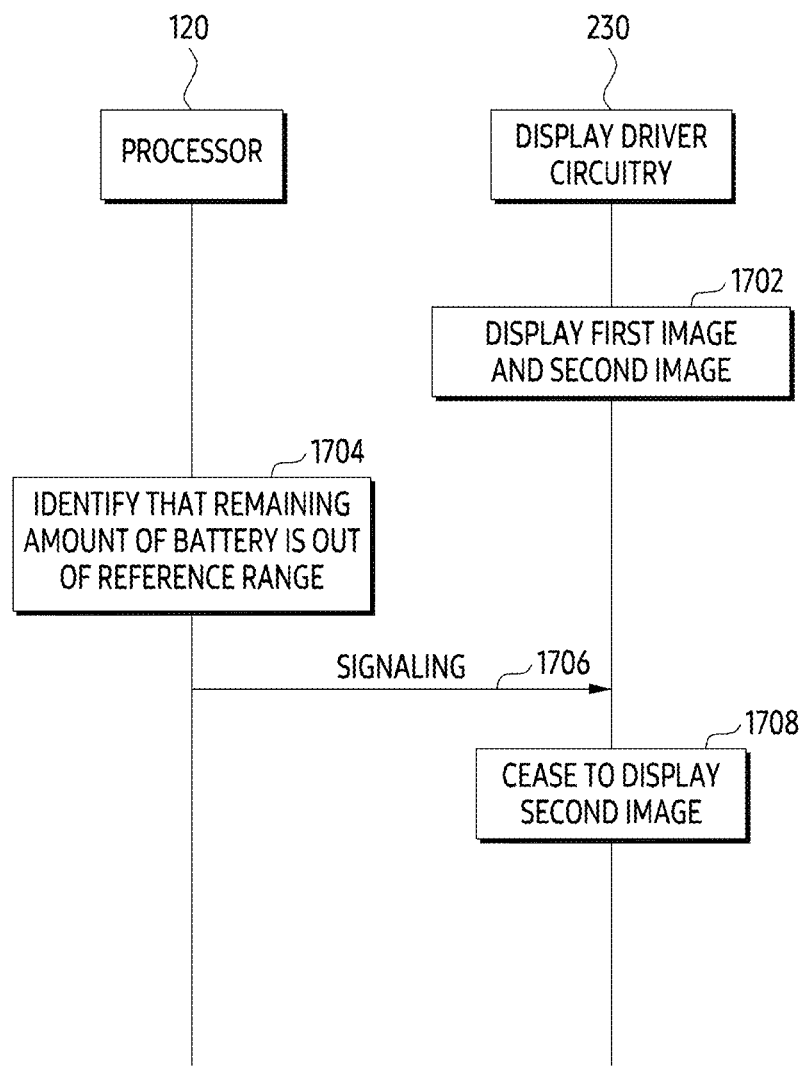
FIG. 17 is a signal flow diagram illustrating a method of ceasing to display a second image based on a state of a battery according to an embodiment of the disclosure.

FIG. 17 is a signal flow diagram illustrating a method of ceasing to display a second image based on a state of a battery according to an embodiment of the disclosure.

This method may be carried out by the electronic device 101 shown in FIG. 1, the electronic device 101 shown in FIG. 3A, the processor 120 of the electronic device 101, and/or the display driver circuitry 230 shown in FIG. 3A.

Operations 1702 to 1708 of FIG. 17 may have relation to the operation 1506 of FIG. 15.

Referring to FIG. 17, in operation 1702, the display driver circuitry 230 may display the first image in the first display area exposed out of the housing of the electronic device 101 and display the second image in the second display area rolled into the housing.

In operation 1704, while displaying the first image and the second image, the processor 120 may identify that a remaining amount of the rechargeable battery (e.g., the battery 189) of the electronic device 101 is out of a reference range. For example, the processor 120 may identify that the remaining amount of the battery reaches a predetermined capacity for identifying whether it required to reduce the power consumed in the electronic device 101, based on a signal obtained from a power management integrated circuit (PMIC) (e.g., the power management module 188) of the electronic device 101. However, it is not limited thereto.

In operation 1706, the processor 120 may transmit, in response to the identification, a signal to ceasing to display the second image in the second display area rolled into the housing, to the display driver circuitry 230. The processor 120 may transmit the signal to the display driving circuit 230, in order to prevent the electrical power from being consumed by displaying of the second image in the second display area rolled into the housing, when the remaining amount of the battery is out of the reference range. The display driver circuitry 230 may receive the signal from the processor 120.

In operation 1708, in response to receiving the signal, the display driver circuitry 230 may cease to display the second image in the second display area rolled into the housing. In an embodiment of the disclosure, the display driver circuitry 230 may, in response to ceasing to display the second image, display the black image in the second display area or deactivate pixels in the second display area. However, it is not limited thereto.

As described above, the electronic device 101 may cease displaying an image in the second display area rolled into the housing when it is necessary to reduce the power consumed in the electronic device 101. Meanwhile, although not shown in FIG. 17, when it is identified that the remaining amount of the battery is out of the reference range, the display driver circuitry 230 may change the brightness of the image displayed in the first display area exposed out of the housing, from a first brightness to a second brightness less than the first brightness. For example, the second brightness may be configured to reduce the difference in voltage between a gate-source voltage of a driving transistor for driving each of pixels in the first display area displaying the first image and a gate-source voltage of a driving transistor for driving each of pixels in the second display area providing the black image. However, it is not limited thereto.

Meanwhile, although not shown in FIG. 17, while displaying the second image in the second display area rolled into the housing, the electronic device 101 may identify an application of which execution is initiated in the electronic device 101 and cease displaying the second image according to the identification. In an embodiment of the disclosure, while displaying the second image in the second display area rolled into the housing, the processor 120 may cease displaying the second image, based on identifying a type of the application that is executed in the electronic device 101 and identifying that the type of the executed application is a predetermined type. The predetermined type of application may be an application of which power consumption in execution is greater than a reference power. For example, the predetermined type of application may include, for example, a game application, a camera application, or the like.

Meanwhile, although not shown in FIG. 17, while displaying the second image in the second display area rolled into the housing, the electronic device 101 may monitor the total power consumed in the electronic device 101, and cease displaying the second image based on monitoring that the total power is greater than the reference power.

Figure 18:
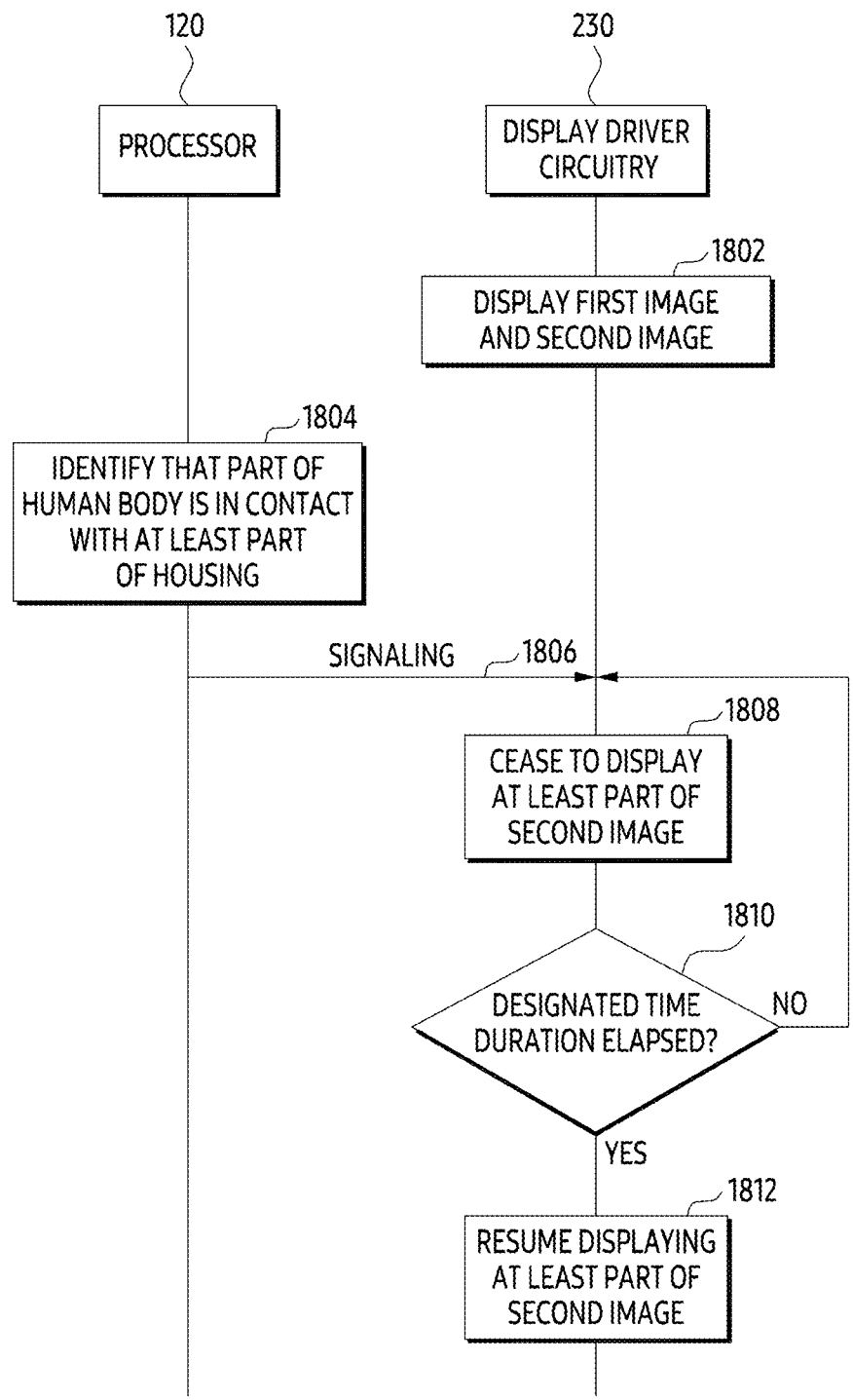
FIG. 18 is a signal flow diagram illustrating a method of ceasing to display a second image based on a user's grip according to an embodiment of the disclosure.

FIG. 18 is a signal flow diagram illustrating a method of ceasing displaying a second image based on a user's grip according to an embodiment of the disclosure.

This method may be carried out by the electronic device 101 shown in FIG. 1, the electronic device 101 shown in FIG. 3A, the processor 120 of the electronic device 101, and/or the display driver circuitry 230 shown in FIG. 3A.

Operations 1802 to 1812 of FIG. 18 may have relation to the operation 1506 of FIG. 15.

Referring to FIG. 18, in operation 1802, the display driver circuitry 230 may display the first image in the first display area exposed out of the housing of the electronic device 101 and display the second image in the second display area rolled into the housing.

In operation 1804, while displaying the first image and the second image, the processor 120 may identify that a portion of the body of a user comes into contact with at least part of the housing of the electronic device 101, through a grip sensor of the electronic device 101. In an embodiment of the disclosure, the at least part of the housing may be defined as a partial area on the electronic device 101 with which a portion of the body (e.g., a user's hand of the electronic device 101) comes into contact, in order to extend the second display area rolled into the housing, out of the housing.

In operation 1806, in response to the identification, the processor 120 may transmit, to the display driver circuitry 230, a signal to cease displaying at least part of the second image while displaying the first image in the first display area. For example, when the portion of the body comes into contact with at least part of the housing, it may imply that it is just before receiving a user input to extend at least part of the second display area rolled into the housing, out of the housing, so the processor 120 may transmit the signal to the display driver circuitry 230 in response to the identification. For example, since at least part of the second image rolled into the housing can be viewed, when the user input is received just after the portion of the body came into contact with the at least part of the housing, the processor 120 may transmit the signal to the display driver circuitry 230 in response to the identification. However, it is not limited thereto.

In operation 1808, the display driver circuitry 230 may, in response to receiving the signal from the processor 120, cease displaying at least part of the second image in the second display area rolled into the housing. Meanwhile, the display driver circuitry 230 may maintain displaying the first image in the first display area exposed out of the housing, independently of receiving the signal from the processor 120. In an embodiment of the disclosure, the display driver circuitry 230 may maintain displaying the remaining part of the second image in the second display area, independently of receiving the signal from the processor 120. When displaying of the remaining part of the second image is maintained, at least part of the second image of which displaying in the second display area ceased may be closer to the boundary between the first display area and the second display area than the remaining part of the second image of which displaying in the second display area is maintained. For example, since the part of the second display area first exposed out of the housing by the user input is an area adjacent to the boundary, the processor 120 may maintain displaying a remaining part of the second image in a partial area of the second display area spaced apart from the boundary, and cease displaying at least part of the second image in the partial area of the second display area adjacent to the boundary.

In operation 1810, after ceasing displaying the at least part of the second image, the display driver circuitry 230 may identify whether a predetermined time duration has elapsed from the timing point when displaying of the at least part of the second image ceased. The predetermined time duration may be set as a time duration taken up until a difference value between a gate-source voltage of driving transistors for driving the pixels in the first display area and a gate-source voltage of driving transistors for driving the pixels in the second display area reaches a certain value that might cause the afterimage. For example, the predetermined time duration may be identified based on a difference in voltage between a gate-source voltage of driving transistors for driving pixels in the first display area, being required to display the first image in the first display area exposed out of the housing, and a gate-source voltage of driving transistors for driving pixels in the second display area. For example, the predetermined time duration may be identified based on the difference by means of a component of the electronic device 101 to monitor the state of the pixels of the first display area and the pixels of the second display area (e.g., the display driver circuitry 230, the processor 120, or any other separate circuitry distinct from the display driver circuitry 230 and the processor 120 and being related to the display 210). However, it is not limited thereto.

In the meantime, while the predetermined time duration is not yet elapsed from the timing point, the display driver circuitry 230 may execute the operation 1808 to maintain ceasing to display the at least part of the second image, and in response to identifying that the predetermined time duration has elapsed from the timing point, execute the operation 1812.

In the operation 1812, the display driver circuitry 230 may resume displaying at least part of the second image, based on identifying that the predetermined time duration has elapsed from the timing point.

Although not shown in FIG. 18, while the processor 120 of the electronic device 101 ceases to display at least part of the second image, the processor 120 of the electronic device 101 may, in a state that the second display area is rolled into the housing, transmit a signal to resume displaying the at least part of the second image, to the display driver circuitry 230, in response to identifying through the grip sensor that a portion of the body is spaced apart from at least part of the housing. The display driver circuitry 230 may resume displaying the at least part of the second image, in response to receiving the signal from the processor 120.

As described above, the electronic device 101 may identify whether the second display area rolled into the housing is to be extended out of the housing, through the grip sensor of the electronic device 101, and according to the identification, cease to display the at least part of the second image displayed in the second display area, thereby preventing the second image displayed in the second display area rolled into the housing from being viewed to the user.

Figure 19:
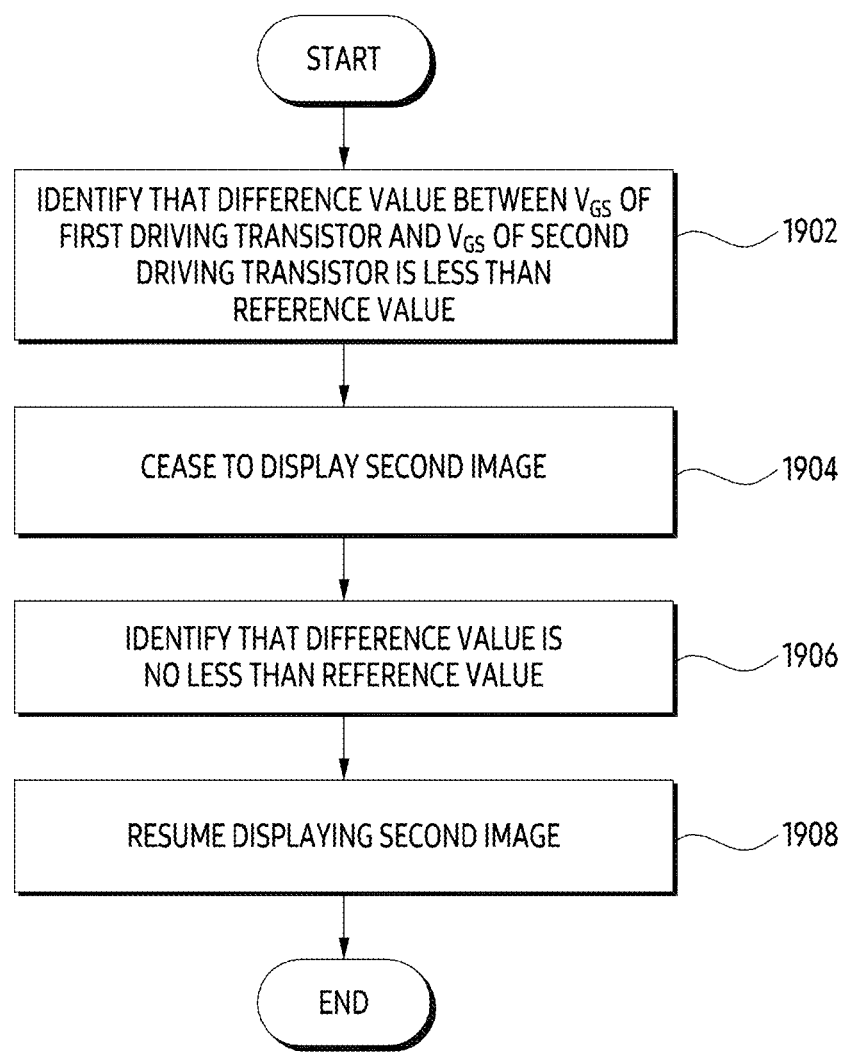
FIG. 19 is a flowchart illustrating a method of ceasing to display a second image based on a difference in voltage between gate-source voltages of driving transistors according to an embodiment of the disclosure.

FIG. 19 is a flowchart illustrating a method of ceasing displaying of a second image based on a difference in voltage between gate-source voltages of driving transistors according to an embodiment of the disclosure.

This method may be carried out by the electronic device 101 shown in FIG. 1, the electronic device 101 shown in FIG. 3A, the processor 120 of the electronic device 101, and/or the display driver circuitry 230 shown in FIG. 3A.

Operations 1902 to 1908 of FIG. 19 may have relation to the operation 1506 of FIG. 15.

Referring to FIG. 19, in operation 1902, while displaying the first image and the second image, the display driver circuitry 230 may identify that a difference value between a gate-source voltage value $V_{GS}$ of a first driving transistor for each of the pixels in the first display exposed out of the housing of the electronic device 101 and a gate-source voltage value $V_{GS}$ of a second driving transistor for each of the pixels in the second display area is less than a reference value. In an embodiment of the disclosure, the first driving transistor may be used to drive a pixel of the first display area located adjacent to the boundary between the first display area and the second display area, and the second driving transistor may be used to drive a pixel located in a horizontal line of the second display area extending from a horizontal line of the first display area in which the pixel of the first display area driven by the first driving transistor is located and disposed adjacent to the boundary. In an embodiment of the disclosure, the display driver circuitry 230 may identify, using at least one component in the display driver circuitry 230, the difference value and then identify that the difference value is less than the reference value. In another embodiment of the disclosure, the display driver circuitry 230 may receive data on the difference value, being identified by another circuit distinct from the display driver circuitry 230, and identify that the difference value indicated by the data received from the other circuit is less than the reference value. In another embodiment of the disclosure, the display driver circuitry 230 may receive a signal to indicate that the difference value is less than the reference value, from another circuit distinct from the display driver circuitry 230, thereby identifying that the difference value is less than the reference value. However, it is not limited thereto.

In operation 1904, in response to the identification, the display driver circuitry 230 may cease to display the second image in the second display area while displaying the first image. Since the fact that the difference value is less than the reference value may imply that the probability that the afterimage occurs at or around the boundary between the first display area and the second display area is relatively low, even if the second display area rolled into the housing is extended out of the housing, the display driver circuitry 230 may cease displaying the second image.

In operation 1906, the display driver circuitry 230 may identify that the difference value is equal to or greater than the reference value, while ceasing displaying the second image. For example, while ceasing displaying the second image, since no voltage is applied to a source of the second driving transistor, the difference value may increase depending on floating of the gate-source voltage of the first driving transistor applied for displaying of the first image and the gate-source voltage of the second driving transistor. The display driver circuitry 230 may identify that the reference value is greater than or equal to the reference value, in order to prevent or minimize occurrence of the afterimage according to the difference in voltage between the gate-source voltage of the first driving transistor and the gate-source voltage of the second driving transistor.

In operation 1908, the display driver circuitry 230, in response to the identification in the operation 1906, may resume displaying the second image to reduce the difference value.

As described above, while displaying the second image in the second display being rolled into the housing, the electronic device 102 may monitor the states of the pixels of the first display area and the pixels of the second display area, being disposed at the position adjacent to the boundary, and cease or resume displaying of the second image according to a result of the monitoring, so as to reduce the electrical power consumed for displaying the second image.

Figure 20:
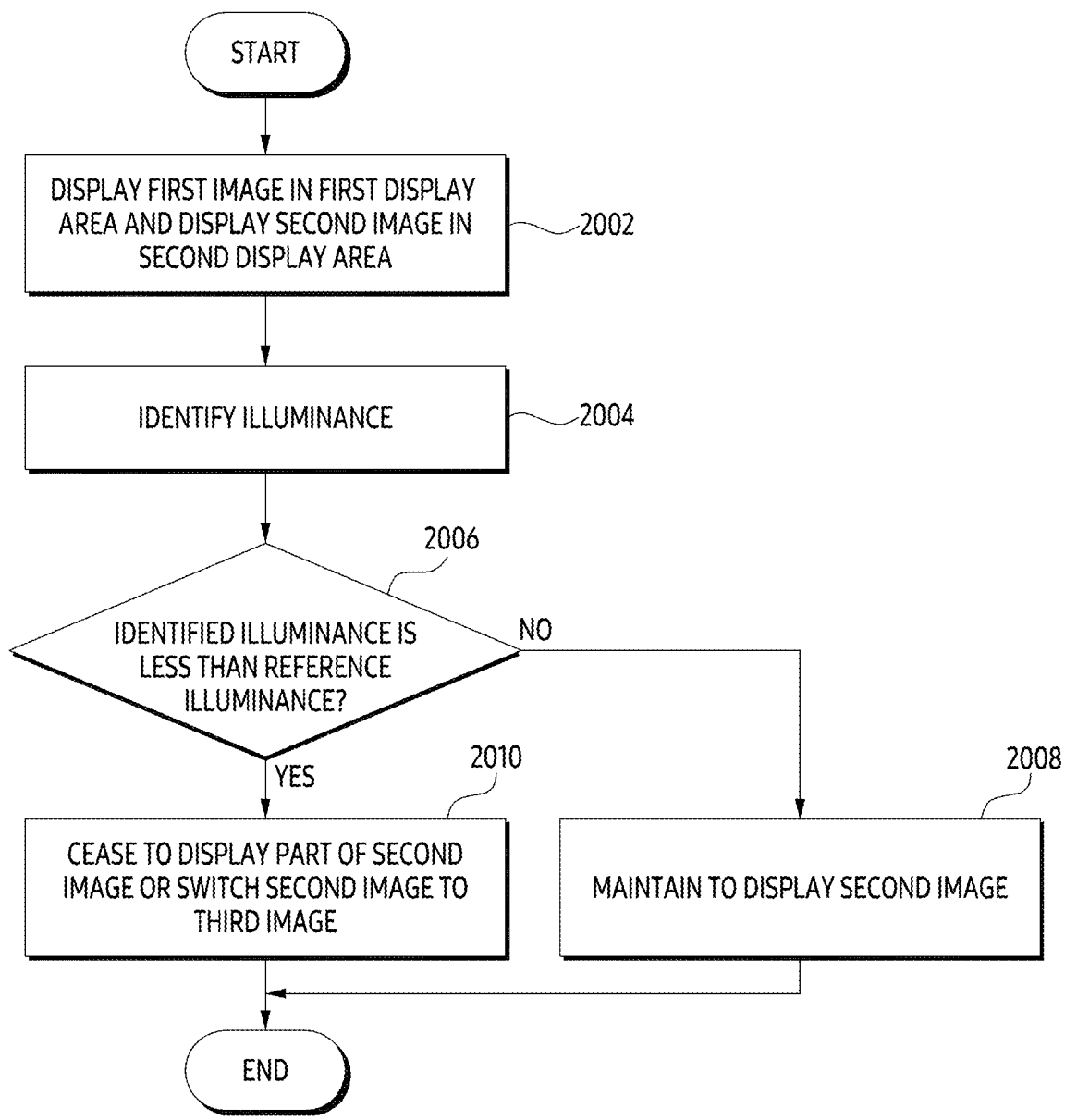
FIG. 20 is a flowchart illustrating a method of processing a second image based on illuminance according to an embodiment of the disclosure.

FIG. 20 is a flowchart illustrating a method of processing a second image based on luminance according to an embodiment of the disclosure.

This method may be executed by the electronic device 101 shown in FIG. 1, the electronic device 101 shown in FIG. 3A, the processor 120 of the electronic device 101, or the display driver circuitry 230 shown in FIG. 3A.

Operations 2002 to 2010 of FIG. 20 may have relation to the operation 1506 of FIG. 15.

Referring to FIG. 20, in operation 2002, the display driver circuitry 230 may display the first image in the first display area exposed out of the housing of the electronic device 101 and display the second image in the second display area rolled into the housing.

In operation 2004, the display driver circuitry 230 may identify illuminance around the electronic device 101 while displaying the first image and the second image. In an embodiment of the disclosure, the processor 120 may obtain data on the luminance around the electronic device 101 using the illuminance sensor of the electronic device 101, while displaying the first image and the second image. The processor 120 may provide information on the illuminance indicated by the data, to the display driver circuitry 230. The display driver circuitry 230 may identify the illuminance based on the information.

In operation 2006, the display driver circuitry 230 may identify whether the identified illuminance is less than a reference illuminance. When the luminance is less than the reference illuminance, it may imply that at least part of the second image displayed in the second display area while displaying the first image in the first display area is highly likely to be viewed through the boundary between the first display area and the second display area. The display driver circuitry 230 may identify whether the identified illuminance is less than the reference illuminance, in order to prevent at least part of the second image at the boundary from being viewed by the user. The display driver circuitry 230 may execute the operation 2008, based on identifying that the identified illuminance is equal to or greater than the reference illuminance, or otherwise execute the operation 2010.

In operation 2008, the display driver circuitry 230 may maintain displaying of the second image, based on identifying that the identified illuminance is equal to or greater than the reference illuminance. Since the identified illuminance being equal to or greater than the reference illuminance may imply that the user is not likely to view at least part of the second image through the boundary, the display driver circuitry 230 may maintain displaying of the second image.

In operation 2010, the display driver circuitry 230 may cease displaying part of the second image or switch the second image to the third image, based on identifying that the identified illuminance is less than the reference illuminance.

In an embodiment of the disclosure, the display driver circuitry 230 may cease displaying the part of the second image in part of the second display area next to the boundary between the first display area and the second display area, based on identifying that the identified illuminance is less than the reference illuminance. Meanwhile, a remaining part of the second image displayed in the remaining part of the second display area may be maintained independently of ceasing displaying of the part of the second image. Further, the black image may be provided the part of the second display area, due to interruption of the displaying. The black image may be provided to prevent the remaining part of the second image from being viewed to the user.

In another embodiment of the disclosure, the display driver circuitry 230 may switch the second image displayed in the second display area to the third image, based on identifying that the identified illuminance is less than the reference illuminance. For example, the third image may be an image having a luminance less than that of the second image. In case where the luminance of the image displayed in the second display area gets lower, even if the illuminance is less than the reference illuminance, the possibility gets less that at least part of the second image in the second display area in the boundary can be viewed to the user, and therefore, the display driver circuitry 230 may switch the second image into the third image. In the meantime, in an embodiment of the disclosure, the luminance of the third image may change depending on the identified illuminance.

Although FIG. 20 illustrates an example in which the display driver circuitry 230 executes the operation 2006, the operation 2006 may be executed by the processor 120. For example, based on identifying the illuminance in the operation 2004 and identifying that the illuminance is less than the reference illuminance in the operation 2006, the processor 120 may transmit, to the display driver circuitry 230, a signal to indicate that the illuminance is less than the reference illuminance or a signal to indicate to cease displaying the part of the second image or to switch the second image to the third image. In such a case, in response to receiving the signal, the display driver circuitry 230 may execute the operation 2010 or otherwise execute the operation 2008.

As described above, the electronic device 101 may adaptively change displaying of the second image in the second display area according to the illuminance around the electronic device 101, thereby further enhancing the usability of the electronic device 101.

Figure 21:
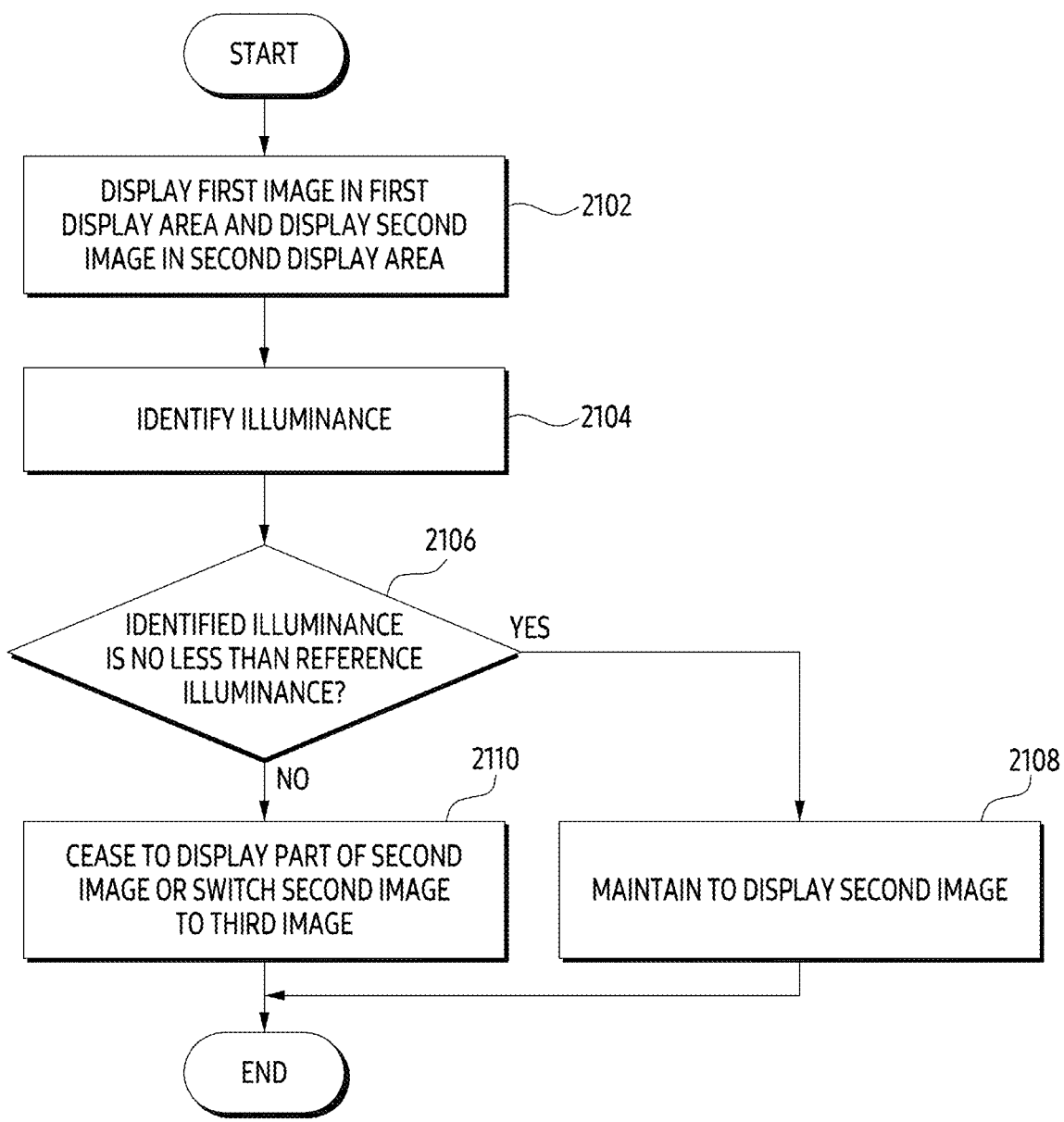
FIG. 21 is a flowchart illustrating a method of processing a second image based on luminance of a partial area of a first display area adjacent to a boundary according to an embodiment of the disclosure.

FIG. 21 is a flowchart illustrating a method of processing a second image based on a luminance of a partial area of a first display area adjacent to a boundary according to an embodiment of the disclosure.

This method may be executed by the electronic device 101 shown in FIG. 1, the electronic device 101 shown in FIG. 3A, the processor 120 of the electronic device 101, or the display driver circuitry 230 shown in FIG. 3A.

Operations 2102 to 2110 of FIG. 21 may have relation to the operation 1506 of FIG. 15.

Referring to FIG. 21, in operation 2102, the display driver circuitry 230 may display the first image in the first display area exposed out of the housing of the electronic device 101 and display the second image in the second display area rolled into the housing.

In operation 2104, while displaying the first image and the second image, the display driver circuitry 230 may identify the luminance of a partial area of the first display area adjacent to the boundary between the first display area and the second display area.

In operation 2106, the display driver circuitry 230 may identify whether the identified luminance is equal to or greater than a reference luminance. When the luminance is equal to or greater than the reference luminance, it may imply that the possibility is relatively low that the at least part of the second image displayed in the second display area while displaying the first image in the first display area can be viewed to the user through the boundary between the first display area and the second display area. The display driver circuitry 230 may identify whether the identified luminance is equal to or greater than the reference luminance in order to prevent the at least part of the second image from being viewed to the user in the boundary. Based on identifying that the identified luminance is equal to or greater than the reference luminance, the display driver circuitry 230 may perform the operation 2108, or otherwise perform the operation 2110.

In operation 2108, the display driver circuitry 230 may maintain displaying of the second image, based on identifying that the identified luminance is equal to or greater than the reference luminance. Since the identified luminance being equal to or greater than the reference luminance may imply that it is unlikely that the at least part of the second image can be viewed through the boundary, the display driver circuitry 230 may maintain displaying of the second image.

In operation 2110, based on identifying that the identified luminance is less than the reference luminance, the display driver circuitry 230 may cease displaying the part of the second image or switch the second image to the third image.

In an embodiment of the disclosure, the display driver circuitry 230 may cease displaying the part of the second image in part of the second display area adjacent to the boundary between the first display area and the second display area, based on identifying that the identified luminance is less than the reference luminance. In the meantime, the remaining part of the second image displayed in the remaining part of the second display area may be maintained independently of the interruption of displaying of the part of the second image. Meanwhile, the black image may be provided in the part of the second display area, due to the interruption of the displaying. The black image may be provided to prevent the remaining part of the second image from being viewed.

In another embodiment of the disclosure, the display driver circuitry 230 may switch the second image displayed in the second display area to the third image, based on identifying that the identified luminance is less than the reference luminance. For example, the third image may be an image having a luminance less than that of the second image. When the luminance of the image displayed in the second display area gets lower, even if the luminance is less than the reference luminance, the possibility gets less that at least part of the image in the second display area can be viewed at the boundary, and therefore, the display driver circuitry 230 may switch the second image to the third image. Meanwhile, in an embodiment of the disclosure, the luminance of the third image may be changed according to the identified luminance.

Although FIG. 21 illustrates an example in which the display driver circuitry 230 executes the operation 2106, the operation 2106 may be executed by the processor 120. For example, based on identifying the luminance in the operation 2104 and identifying that the luminance is less than the reference luminance in the operation 2106, the processor 120 may transmit, to the display driver circuitry 230, a signal to indicate that the luminance is less than the reference luminance or a signal to indicate to cease displaying the part of the second image or switch the second image to the third image. In this instance, in response to receiving the signal, the display driver circuitry 230 may perform the operation 2110 or otherwise perform the operation 2108.

As apparent from the foregoing description, the electronic device 101 can adaptively switch displaying of the second image in the second display area according to the illuminance around the electronic device 101, so that the usability of the electronic device 101 can be further enhanced.

An electronic device (e.g., the electronic device 101 shown in FIG. 1 or FIG. 3A) disclosed heretofore may include a housing (e.g., the housing 300 shown in FIG. 3A), a display rollable into the housing (e.g., the display 210 shown in FIG. 2 or 3A), and a display driver circuitry operatively coupled to the display (e.g., the display driver IC 230 shown in FIG. 2 or the display driver circuitry 230 shown in FIG. 3A), wherein the display driver circuitry may be configured to display, while the electronic device is in a first state in which a first display area of the display is exposed and a second display area of the display right next to the first display area is rolled into the housing, a first image in the exposed first display area; obtain, while displaying the first image, a second image based on applying a first weight to a pixel value of a first pixel of a first horizontal line of the first display area and applying a second weight less than the first weight to a pixel value of a second pixel of the first horizontal line of the first display area, wherein the first pixel of the first horizontal line of the first display area is spaced apart by a first distance from a boundary between the first display area and the second display area, and wherein the second pixel of the first horizontal line of the first display area is spaced apart by a second distance greater than the first distance from the boundary; and display, while displaying the first image in the first display area, the second image in the second display area rolled into the housing.

In an embodiment of the disclosure, the display driver circuitry may be configured to display, while displaying the first image in the first display area and obtaining the second image, a third image in the second display area, and display, in response to obtaining the second image, the second image by switching the third image displayed in the second display area to the second image.

In an embodiment of the disclosure, a color of the entire area of the third image may be configured with black.

In an embodiment of the disclosure, the display driver circuitry may be configured to obtain the second image and switch the third image to the second image, in order to reduce a difference between a gate-source voltage of a driving transistor for a pixel of the first display area right next to the boundary and a gate-source voltage of a driving transistor for a pixel of the second display area right next to the boundary.

In an embodiment of the disclosure, the display driver circuitry may be configured to identify, while displaying the first image and the second image, that the first state is switched to a second state in which at least part of the second display area rolled into the housing is exposed, and display, in response to the identification, a third image in a third display area including the exposed first display area and the exposed at least part of the second display area, and display part of the second image in a fourth display area including remaining part of the second display area.

In an embodiment of the disclosure, the display driver circuitry may be further configured to obtain, while displaying the part of the second image and the third image, a fourth image based on applying a third weight to a pixel value of a first pixel of the first horizontal line of the third display area and applying a fourth weight less than the third weight to a pixel value of a second pixel of the first horizontal line of the third display area, wherein the first pixel of the first horizontal line of the third display area is spaced apart by a third distance from a boundary between the third display area and the fourth display area, and the second pixel of the first horizontal line of the third display area is spaced apart by a fourth distance greater than the third distance from the boundary between the third display area and the fourth display area, and switch the part of the second image displayed in the fourth display area to the fourth image.

In an embodiment of the disclosure, the display driver circuitry may be configured to respectively obtain, while displaying the first image, first values regarding horizontal lines of the first display area, based on respectively applying weights to pixel values of pixels of each of the horizontal lines of the first display area, and obtain the second image based on the first values, wherein at least part of the weights respectively applied to the pixel values may be identified based on a distance between each of the pixels and the boundary.

In an embodiment of the disclosure, the horizontal lines of the first display area may further include a second horizontal line of the first display area below or above the first horizontal line of the first display area, and the display driver circuitry may be configured to obtain a second value regarding a first horizontal line of the second display area extending from the first horizontal line of the first display area, based on applying a third weight to a value regarding the first horizontal line of the first display area among the first values and applying a fourth weight less than the third weight to a value regarding the second horizontal line of the first display area among the first values, and obtain the second image, based on the second value.

In an embodiment of the disclosure, the display driver circuitry may be configured to obtain fourth values between the second value and a third value higher than the second value or obtain sixth values between the second value and a fifth value less than the second value, and obtain the second image including an area having a gradation effect, by configuring an area of the second image corresponding to the first horizontal line of the second display area based on the fourth values or the sixth values, wherein a pixel value of a first pixel of the first horizontal line of the second display area spaced apart by a third distance from the boundary may be, while displaying the second image, higher than a pixel value of a second pixel of the first horizontal line of the second display area spaced apart by a fourth distance greater than the third distance from the boundary.

In an embodiment of the disclosure, the display driver circuitry may be configured to obtain, based on gradually changing the second value until the second value reaches a third value less than the second value, fourth values including the third value; obtain, based on gradually changing the third value until the third value reaches a fifth value higher than the third value, sixth values including the fifth value; and obtain the second image including an area having a gradation effect configured with a plurality of sections by configuring an area of the second image corresponding to the first horizontal line of the second display area based on the fourth values and the sixth values, wherein pixels of the first horizontal line of the second display area associated with the fourth values may be, while displaying the second image, disposed closer to the boundary than pixels of the first horizontal line of the second display area associated with the sixth values.

In an embodiment of the disclosure, the second image may include the area having the gradation effect configured with the plurality of sections in order to reduce a difference between a gate-source voltage of a driving transistor for a pixel of the first display area right next to the boundary and a gate-source voltage of a driving transistor for a pixel of the second display area right next to the boundary.

In an embodiment of the disclosure, the second display area may include a first partial area right next to the boundary and a second partial area right next to the first partial area, wherein the display driver circuitry may be configured to obtain pixel values of first pixels of a first horizontal line extending from a first horizontal line of the first display area, based on a second value regarding the first horizontal line of the first display area among the first values and third values regarding a second horizontal lines of the first display area located within a third distance from the first horizontal line of the first display area among the first values; obtain pixel values of second pixels of a first horizontal line of the second partial area extending from the first horizontal line of the first partial area, based on the second value among the first values and fourth values regarding third horizontal lines of the first display area located within a fourth distance from the first horizontal line of the first display area among the first values; and obtain the second image, based on pixels values of first pixels of the first horizontal line of the first partial area and pixel values of second pixels of the first horizontal line of the second partial area, and wherein the fourth distance may be greater than the third value.

In an embodiment of the disclosure, the display driver circuitry may be configured to obtain the second image, based on the pixel values of the first pixels of the first horizontal line of the first partial area and the pixel values of the second pixels of the first horizontal line of the second partial area, in order to reduce a difference in voltage between a gate-source voltage of at least one driving transistor for a first horizontal line of the second display area including the first horizontal line of the first partial area and the first horizontal line of the second partial area and a gate-source voltage of at least one driving transistor for a second horizontal line of the second display area.

In an embodiment of the disclosure, the display driver circuitry DDI may be configured to obtain, based on applying a third weight to a value regarding the first horizontal line of the first display area among the first values and applying a fourth weight less than the third weight to values regarding horizontal lines of the first display area located within a third distance from the first horizontal line of the first display area among the first values, second values regarding horizontal lines of the second display area; and obtain, based on the second values, the second image, and wherein the DDI may be further configured to respectively obtain, while displaying a third image after the first image in the exposed first display area, third values regarding horizontal lines of the first display area, based on respectively applying the weights to pixel values of pixels of each of horizontal lines of the first display area, wherein the third values are obtained for a fourth image after the second image; obtain fourth values regarding horizontal lines of the second display area, based on applying the third weight to a value regarding the first horizontal line of the first display area among the third values and applying the fourth weight to values regarding the horizontal lines of the first display area located within the third distance from the first horizontal line of the first display area among the third values, wherein the fourth values are obtained for the fourth image; identify whether a difference value between a fifth value regarding the first horizontal line of the second display area among the second values and a sixth value regarding the first horizontal line of the second display area among the fourth values is outside of a reference range; obtain, based on identifying that the difference value is outside of the reference range, the fourth image including an area corresponding to the first horizontal line of the second display area obtained based on the sixth value; obtain, based on identifying that the difference value is within the reference range, the fourth image including the area corresponding to the first horizontal line of the second display area, obtained based on the fifth value; and display, while displaying the third image, the fourth image in the second display area rolled into the housing.

In an embodiment of the disclosure, the display driver circuitry may be configured to obtain second values regarding horizontal lines of the second display area, based on applying a third weight to a value regarding the first horizontal line of the first display area among the first values and applying a fourth weight less than the third weight to values regarding horizontal lines of the first display area located within a third distance from the first horizontal line of the first display area among the first values; and obtain the second image based on the second values, and wherein the display driver circuitry may be further configured to respectively obtain, while displaying a third image after the first image in the exposed first display area, third values regarding the horizontal lines of the first display area based on respectively applying the weights to pixel values of pixels of each of the horizontal lines of the first display area, wherein the third values are obtained for a fourth image after the second image; obtain, based on applying the third weight to a value regarding the first horizontal line of the first display area among the third values and applying the fourth weight to values regarding the horizontal lines of the first display area located within the third distance from the first horizontal line of the first display area among the third values, fourth values regarding horizontal lines of the second display area, wherein the fourth values are obtained for the fourth image; identify, by comparing the fourth values with the second values with respect to each of the horizontal lines of the second display area, a number of at least part of the horizontal lines of the second display area changed by no less than a reference value; based on identifying that the identified number is greater than or equal to a designated value, switch the second image displayed in the second display area rolled into the housing while displaying the third image, to the fourth image; and based on identifying that the identified number is less than the designated value, maintain to display the second image in the second display area rolled into the housing while displaying the third image.

In an embodiment of the disclosure, the electronic device may further include a rechargeable battery (e.g., battery 189 shown in FIG. 1) and a processor (e.g., the processor 120 shown in FIG. 1 or the processor 120 shown in FIG. 3A), operably coupled to the battery and the display driver circuit, the processor being configured to identify, while displaying the first image and the second image, that remaining amount of the battery is out of a reference range, and provide, in response to the identification, a signal for ceasing to display the second image while displaying the first image in the first display area to the display driver circuitry, wherein the display driver circuit may be further configured to cease, in response to obtaining the signal from the processor, to display the second image while displaying the first image in the first display area.

In an embodiment of the disclosure, the electronic device may further include a grip sensor (a grip sensor in the sensor module 176 shown in FIG. 1) for detecting a contact onto a portion of a human body, and a processor (e.g., a processor 120 shown in FIG. 1 or a processor 120 shown in FIG. 3A), operably coupled to the grip sensor and the display driver circuit, the processor being configured to identify, while displaying the first image and the second image, that the portion of the body is in contact with at least part of the housing through the grip sensor, and provide, in response to the identification, a signal for ceasing to display at least part of the second image while displaying the first image in the first display area to the display driver circuitry, wherein the display driver circuit may be further configured to cease, in response to obtaining the signal from the processor, to display the at least part of the second image while displaying the first image in the first display area.

In an embodiment of the disclosure, ceasing to display the at least part of the second image may be maintained while the contact onto the portion of the body is maintained.

In an embodiment of the disclosure, the at least part of the second image of which displaying ceased may be closer to the boundary than the remaining part of the second image of which displaying is maintained.

In an embodiment of the disclosure, displaying of the at least part of the second image may be resumed after a lapse of a predetermined time duration from a timing point at which displaying of the at least part of the second image was ceased.

In an embodiment of the disclosure, the processor may be configured to identify, while the state of the electronic device is maintained in the first state and displaying of at least part of the second image is ceased, via the grip sensor that the portion of the body is spaced apart from the at least part of the housing, and provide a signal, to the display driver circuitry, to resume displaying of the at least part of the second image, in response to identifying that the portion of the body is spaced apart from the at least part of the housing, wherein the display driver circuitry may be further configured to, in response to obtaining the signal to resume displaying of the at least part of the second image from the processor, resume displaying of the at least part of the second image.

In an embodiment of the disclosure, the electronic device may further include a circuit configured to identify a difference value between a gate-source voltage value of at least one driving transistor for the first display area and a gate-source voltage value of at least one driving transistor for the second display area, and the display driver circuitry may be further configured to cease to display the second image while displaying the first image, in response to receiving a signal to indicate that the difference value is less than a reference value from the circuit, and resume displaying the second image while displaying the first image, in response to receiving a signal to indicate that the difference value is no less than the reference value from the circuit, while ceasing to display the second image.

In an embodiment of the disclosure, the display driver circuitry may be further configured to obtain, while displaying the first image in the exposed display area, pixel values of pixels in a vertical line of the first display area right next to the boundary, obtain a third image based on assigning a pixel value of a pixel located in a first horizontal line of the first display area among the obtained pixel values, to each of pixel values of pixels of a first horizontal line of the second display area extending from the first horizontal line of the first display area, and display the third image in the second display area rolled into the housing, while displaying the first image in the first display area.

In an embodiment of the disclosure, the display driver circuitry may be further configured to obtain, while displaying the first image in the exposed display area, pixel values of pixels in a vertical line of the first display area right next to the boundary, obtain second values including a first value, based on gradually changing a pixel value of a first pixel of a first horizontal line of the first display area until a pixel value of a first pixel of a first horizontal line of the first display area among the obtained pixel values reaches the first value less than a pixel value of a first pixel of a horizontal line of the first display area, obtain a third image including an area having a gradation effect, based on respectively assigning the second values to pixels of a first horizontal line of the second display area extending from the first horizontal line of the first display area, and display the third image in the second display area rolled into the housing, while displaying the first image in the first display area, wherein a pixel value of a pixel of a first horizontal line of the second display area spaced apart by a third distance from the boundary may be higher than a pixel value of a pixel in a first horizontal line of the second display area spaced apart from the boundary by a fourth distance greater than the third distance, while displaying the third image.

In an embodiment of the disclosure, the display driver circuitry may be configured to obtain pixel values of pixels in a vertical line of the first display area right next to the boundary, while displaying the first image in the exposed display area, obtain second values including a first value, based on gradually changing an average value until the average value of the obtained pixel values reaches a first value less than the average value, obtain a third image including an area having a gradation effect, based on respectively assigning the second values to pixels of a first horizontal line of the second display area, and display the third image in the second display area rolled into the housing, while displaying the first image in the first display area, wherein a pixel value of a pixel of a first horizontal line of the second display area spaced apart by a third distance from the boundary may be higher than a pixel value of a pixel in a first horizontal line of the second display area spaced apart from the boundary by a fourth distance greater than the third distance, while displaying the third image.

In an embodiment of the disclosure, the first display area may include a first partial area extending by a third distance from the boundary and a second partial area right next to the first partial area, and the second display area may include a third partial area extending by the third distance from the boundary and a fourth partial area right next to the third partial region, wherein the display driver circuitry may be configured to obtain, while displaying the first image in the exposed display area, a third image to be displayed in the fourth partial area based on switching at least part of the first image, display, while displaying the first image in the first display area, at least part of the first image displayed in the first partial area, in the third partial area in the second display area rolled into the housing, and display the third image in the fourth partial area in the second display area rolled into the housing.

As described above, according to one embodiment of the disclosure, provided is a method (e.g., the operations 1502 to 1506 illustrated in FIG. 15) for operating an electronic device including a housing and a display rollable into the housing, the method comprising displaying, while the electronic device is in a first state in which a first display area of the display is exposed and a second display area of the display right next to the first display area is rolled into the housing, a first image in the exposed first display area; obtaining, while displaying the first image, a second image based on applying a first weight to a pixel value of a first pixel of a first horizontal line of the first display area and applying a second weight less than the first weight to a pixel value of a second pixel of the first horizontal line of the first display area, wherein the first pixel of the first horizontal line of the first display area is spaced apart by a first distance from a boundary between the first display area and the second display area, and the second pixel of the first horizontal line of the first display area is spaced apart by a second distance greater than the first distance from the boundary; and displaying, while displaying the first image in the first display area, the second image in the second display area rolled into the housing.

As described above, according to one embodiment of the disclosure, provided is a non-transitory computer readable storage medium storing at least one program including instructions that may, when executed by a processor (e.g., the processor 120 shown in FIG. 1 or the processor 120 shown in FIG. 3A) of an electronic device (e.g., the electronic device 101 shown in FIG. 1 or the electronic device 101 shown in FIG. 3A) including a housing and a display (e.g., the display 210 shown in FIG. 3A) rollable into the housing, cause the electronic device to display, while the electronic device is in a first state in which a first display area of the display is exposed and a second display area of the display right next to the first display area is rolled into the housing, a first image in the exposed first display area; obtain, while displaying the first image, a second image based on applying a first weight to a pixel value of a first pixel of a first horizontal line of the first display area and applying a second weight less than the first weight to a pixel value of a second pixel of the first horizontal line of the first display area, wherein the first pixel of the first horizontal line of the first display area is spaced apart by a first distance from a boundary between the first display area and the second display area, and the second pixel of the first horizontal line of the first display area is spaced apart by a second distance greater than the first distance from the boundary; and display, while displaying the first image in the first display area, the second image in the second display area rolled into the housing.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may be interchangeably used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities, and some of the multiple entities may be separately disposed in different components. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the scope of the disclosure as defined by the appended claims and their equivalents.

The invention claimed is:

1. An electronic device comprising:
a housing;
a display rollable into the housing; and
display driver circuitry operably coupled to the display, the display driver circuitry configured to:
  display, while the electronic device is in a first state in which a first display area of the display is exposed and a second display area of the display adjacent to the first display area is rolled into the housing, a first image in the exposed first display area,
  obtain, while displaying the first image, a second image based on applying a first weight to a pixel value of a first pixel of a first horizontal line of the first display area and applying a second weight less than the first weight to a pixel value of a second pixel of the first horizontal line of the first display area, wherein the first pixel of the first horizontal line of the first display area is spaced apart by a first distance from a boundary between the first display area and the second display area, and the second pixel of the first horizontal line of the first display area is spaced apart by a second distance greater than the first distance from the boundary, and
  display, while displaying the first image in the first display area, the second image in the second display area rolled into the housing.

2. The electronic device of claim 1,
wherein the display driver circuitry is further configured to:
  display, while displaying the first image in the first display area and obtaining the second image, a third image in the second display area rolled into the housing, and
  wherein, to display the second image, the display driver circuitry is further configured to display, in response to obtaining the second image, the second image by switching the third image displayed in the second display area to the second image.

3. The electronic device of claim 2, wherein a color of an entire area of the third image is configured with black.

4. The electronic device of claim 3, wherein the display driver circuitry is further configured to:
  obtain the second image and switch the third image to the second image, to reduce a difference between a gate-source voltage of a driving transistor for a pixel of the first display area adjacent to the boundary and a gate-source voltage of a driving transistor for a pixel of the second display area adjacent to the boundary.

5. The electronic device of claim 1, wherein the display driver circuitry is further configured to:
  identify, while displaying the first image and the second image, that the first state is switched to a second state in which at least part of the second display area rolled into the housing is exposed, and
  in response to identifying that the first state is switched to the second state:
    display a third image in a third display area, wherein the third display area includes the exposed first display area and the exposed at least part of the second display area, and
    display part of the second image in a fourth display area including remaining part of the second display area.

6. The electronic device of claim 5, wherein the display driver circuitry is further configured to:
  obtain, while displaying the part of the second image and the third image, a fourth image based on applying a third weight to a pixel value of a first pixel of the first horizontal line of the third display area and applying a fourth weight less than the third weight to a pixel value of a second pixel of the first horizontal line of the third display area, wherein the first pixel of the first horizontal line of the third display area is spaced apart by a third distance from a boundary between the third display area and the fourth display area, and the second pixel of the first horizontal line of the third display area is spaced apart by a fourth distance greater than the third distance from the boundary between the third display area and the fourth display area, and
  switch the part of the second image displayed in the fourth display area to the fourth image.

7. The electronic device of claim 1,
wherein the display driver circuitry is further configured to:
  obtain, while displaying the first image, a first value for each horizontal line included in the first display area, based on applying a weight to a pixel value for each pixel included in each horizontal line included in the first display area, and
  obtain the second image based on the first value for each horizontal line included in the first display area, and
wherein at least part of the weight that is applied to each pixel value is identified based on a distance between each pixel and the boundary.

8. The electronic device of claim 7,
wherein the display driver circuitry is further configured to:
  obtain a second value for a first horizontal line included in the second display area extended from a first horizontal line included in the first display area, based on applying a third weight to a value corresponding to the first horizontal line of the first display area and applying a fourth weight less than the third weight to a value corresponding to a second horizontal line included in the first display area, and
  obtain the second image, based on the second value, and
  wherein the second horizontal line included in the first display area is disposed above or below the first horizontal line included in the first display area.

9. The electronic device of claim 8,
wherein the display driver circuitry is further configured to:
  obtain fourth values between the second value and a third value higher than the second value or obtain sixth values between the second value and a fifth value less than the second value, and
  obtain the second image including an area having a gradation effect, by configuring an area of the second image corresponding to the first horizontal line of the second display area based on the fourth values or the sixth values, and
  wherein a pixel value of a first pixel of the first horizontal line of the second display area spaced apart by a third distance from the boundary is, while displaying the second image, higher than a pixel value of a second pixel of the first horizontal line of the second display area spaced apart by a fourth distance greater than the third distance from the boundary.

10. The electronic device of claim 8,
wherein the display driver circuitry is further configured to:
- based on gradually changing the second value until the second value reaches a third value less than the second value, obtain fourth values including the third value,
- based on gradually changing the third value until the third value reaches a fifth value higher than the third value, obtain sixth values including the fifth value, and
- obtain the second image including an area having a gradation effect configured with a plurality of sections, by configuring an area of the second image corresponding to the first horizontal line of the second display area based on the fourth values and the sixth values,
- wherein, while displaying the second image, pixels of the first horizontal line of the second display area associated with the fourth values are disposed closer to the boundary than pixels of the first horizontal line of the second display area associated with the sixth values.

11. The electronic device of claim 10, wherein the second image includes the area having the gradation effect configured with the plurality of sections to reduce a difference between a gate-source voltage of a driving transistor for a pixel of the first display area adjacent to the boundary and a gate-source voltage of a driving transistor for a pixel of the second display area adjacent to the boundary.

12. The electronic device of claim 7,
wherein the second display area includes a first partial area adjacent to the boundary and a second partial area adjacent to the first partial area,
wherein the display driver circuitry is further configured to:
- obtain pixel values of first pixels of a first horizontal line included in the first partial area extended from the first horizontal line of the first display area, based on a second value regarding the first horizontal line of the first display area among the first values and third values regarding second horizontal lines of the first display area located within a third distance from the first horizontal line of the first display area among the first values,
- obtain pixel values of second pixels of a first horizontal line of the second partial area extended from the first horizontal line of the first partial area, based on the second value among the first values and fourth values regarding third horizontal lines located within a fourth distance from the first horizontal line of the first display area among the first values, and
- obtain the second image, based on pixels values of first pixels of the first horizontal line of the first partial area and pixel values of second pixels of the first horizontal line of the second partial area, and
wherein the fourth distance is greater than the third value.

13. The electronic device of claim 12, wherein the display driver circuitry is further configured to obtain, based on the pixel values of the first pixels of the first horizontal line of the first partial area and the pixel values of the second pixels of the first horizontal line of the second partial area, the second image, to reduce a difference between a gate-source voltage of at least one driving transistor for a first horizontal line of the second display area including the first horizontal line of the first partial area and the first horizontal line of the second partial area, and a gate-source voltage of at least one driving transistor for a second horizontal line of the second display area.

14. The electronic device of claim 7,
wherein the display driver circuitry is further configured to:
- based on applying a third weight to a value regarding the first horizontal line of the first display area and applying a fourth weight less than the third weight to values regarding horizontal lines of the first display area located within a third distance from the first horizontal line of the first display area, obtain second values regarding horizontal lines of the second display area,
- obtain, based on the second values, the second image,
- while displaying a third image after the first image in the exposed first display area, a third value for each horizontal line included in the first display area, based on applying the weight to the pixel value for each pixel included in each horizontal line included in the first display area, obtain the third values being obtained for a fourth image after the second image,
- obtain fourth values regarding horizontal lines of the second display area, based on applying the third weight to a value regarding the first horizontal line of the first display area among the third values and applying the fourth weight to values regarding the horizontal lines of the first display area located within the third distance from the first horizontal line of the first display area among the third values, the fourth values being obtained for the fourth image,
- identify whether a difference value between a fifth value regarding the first horizontal line of the second display area among the second values and a sixth value regarding the first horizontal line of the second display area among the fourth values is outside of a reference range,
- obtain, based on identifying that the difference value is outside of the reference range, the fourth image including an area corresponding to the first horizontal line of the second display area obtained based on the sixth value,
- obtain, based on identifying that the difference value is within the reference range, the fourth image including the area corresponding to the first horizontal line of the second display area obtained based on the fifth value, and
- display, while displaying the third image, the fourth image in the second display area rolled into the housing.

15. The electronic device of claim 7,
wherein the display driver circuitry is further configured to:
- obtain second values regarding horizontal lines of the second display area, based on applying a third weight to a value regarding the first horizontal line of the first display area among the first values and applying a fourth weight less than the third weight to values regarding horizontal lines of the first display area located within a third distance from the first horizontal line of the first display area among the first values, and
- obtain the second image based on the second values,
- while displaying a third image after the first image in the exposed first display area, obtain a third value for each horizontal line included in the first display area based on applying the weight to the pixel value for each pixel included in each horizontal line included in the first display area, the third values being obtained for a fourth image after the second image, obtain, based on applying the third weight to a value regarding the first horizontal line of the first display area among the third values and applying the fourth weight to values regarding the horizontal lines of the first display area located within the third distance from the first horizontal line of the first display area among the third values, fourth values regarding horizontal lines of the second display area, the fourth values being obtained for the fourth image, identify, by comparing the fourth values with the second values with respect to each of the horizontal lines of the second display area, a number of at least part of the horizontal lines of the second display area changed by more than a reference value, based on identifying that the identified number is greater than or equal to a designated value, switch the second image displayed in the second display area rolled into the housing while displaying the third image, to the fourth image, and based on identifying that the identified number is less than the designated value, maintain to display the second image in the second display area rolled into the housing while displaying the third image.

16. The electronic device of claim 1, further comprising:
a rechargeable battery; and
a processor, operably coupled to the battery and the display driver circuitry,
wherein the processor is configured to:
identify, while displaying the first image and the second image, that remaining amount of the battery is outside of a reference range, and
provide, in response to the identification that the remaining amount of the battery is outside of the reference range, a signal for ceasing to display the second image while displaying the first image in the first display area, to the display driver circuitry, and
wherein the display driver circuitry is further configured to cease, in response to obtaining the signal from the processor, displaying the second image while displaying the first image in the first display area.

17. The electronic device of claim 1, further comprising:
a grip sensor for detecting a contact of a portion of a human body; and
a processor operably coupled to the grip sensor and the display driver circuitry, the processor configured to:
while displaying the first image and the second image, receive an input from the grip sensor indicating that the portion of the body is contacted on at least part of the housing, and
provide, in response to receiving the input from the grip sensor, a signal for ceasing to display at least part of the second image while displaying the first image in the first display area to the display driver circuitry,
wherein the display driver circuitry is further configured to cease, in response to obtaining the signal from the processor, displaying the at least part of the second image while displaying the first image in the first display area.

18. The electronic device of claim 17, wherein ceasing to display the at least part of the second image is maintained while the input indicating that the portion of the body is contacted on the at least part of the housing is maintained.

19. A method for operating an electronic device comprising a housing and a display rollable into the housing, the method comprising:
displaying, while the electronic device is in a first state in which a first display area of the display is exposed and a second display area of the display adjacent to the first display area is rolled into the housing, a first image in the exposed first display area;
obtaining, while displaying the first image, a second image based on applying a first weight to a pixel value of a first pixel of a first horizontal line of the first display area and applying a second weight less than the first weight to a pixel value of a second pixel of the first horizontal line of the first display area, wherein the first pixel of the first horizontal line of the first display area is spaced apart by a first distance from a boundary between the first display area and the second display area, and the second pixel of the first horizontal line of the first display area is spaced apart by a second distance greater than the first distance from the boundary; and
displaying, while displaying the first image in the first display area, the second image in the second display area rolled into the housing.

20. At least one non-transitory computer readable storage medium storing one or more programs, the one or more programs comprising instructions which, when executed by a processor of an electronic device comprising a housing and a display rollable into the housing, cause the electronic device to:
display, while the electronic device is in a first state in which a first display area of the display is exposed and a second display area of the display adjacent to the first display area is rolled into the housing, a first image in the exposed first display area;
obtain, while displaying the first image, a second image based on applying a first weight to a pixel value of a first pixel of a first horizontal line of the first display area and applying a second weight less than the first weight to a pixel value of a second pixel of the first horizontal line of the first display area, wherein the first pixel of the first horizontal line of the first display area is spaced apart by a first distance from a boundary between the first display area and the second display area, and the second pixel of the first horizontal line of the first display area is spaced apart by a second distance greater than the first distance from the boundary; and
display, while displaying the first image in the first display area, the second image in the second display area rolled into the housing.

* * * * *